(12) United States Patent
Kim

(10) Patent No.: US 11,749,361 B2
(45) Date of Patent: *Sep. 5, 2023

(54) MEMORY DEVICE AND OPERATING METHOD THEREOF

(71) Applicant: SK hynix Inc., Gyeonggi-do (KR)

(72) Inventor: Young Il Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/859,795

(22) Filed: Jul. 7, 2022

(65) Prior Publication Data
US 2022/0351791 A1    Nov. 3, 2022

Related U.S. Application Data

(63) Continuation of application No. 17/220,453, filed on Apr. 1, 2021, now Pat. No. 11,456,041.

(30) Foreign Application Priority Data

Oct. 20, 2020  (KR) ........................ 10-2020-0136192

(51) Int. Cl.
*G11C 16/04* (2006.01)
*G11C 16/14* (2006.01)
*G11C 16/34* (2006.01)
*G11C 16/10* (2006.01)
*G11C 16/08* (2006.01)
*G11C 16/30* (2006.01)
*G11C 16/24* (2006.01)
*G11C 16/26* (2006.01)

(52) U.S. Cl.
CPC ........... *G11C 16/3459* (2013.01); *G11C 16/08* (2013.01); *G11C 16/10* (2013.01); *G11C 16/24* (2013.01); *G11C 16/26* (2013.01); *G11C 16/30* (2013.01)

(58) Field of Classification Search
CPC ..... G11C 16/3459; G11C 16/08; G11C 16/10; G11C 16/24; G11C 16/26; G11C 16/30; G11C 2211/5621; G11C 2211/5642; G11C 11/5628; G11C 16/0483; G11C 16/32
See application file for complete search history.

(56) References Cited

U.S. PATENT DOCUMENTS 11,456,041 B2 *    9/2022   Kim ................... G11C 16/0483

* cited by examiner

*Primary Examiner* — Hien N Nguyen
(74) *Attorney, Agent, or Firm* — IP & T GROUP LLP

(57) ABSTRACT

There are provided a memory device for improving performance by decreasing a time at which a program operation is completed while decreasing a peak current flowing through a bit line, and an operating method of the memory device.

12 Claims, 19 Drawing Sheets

# MEMORY DEVICE AND OPERATING METHOD THEREOF

CROSS-REFERENCE TO RELATED APPLICATION

The present application is a continuation of U.S. patent application Ser. No. 17/220,453 filed on Apr. 1, 2021, which claims priority under 35 U.S.C. § 119(a) to Korean patent application number 10-2020-0136192, filed on Oct. 20, 2020, which is incorporated herein by reference in its entirety.

BACKGROUND

Field of Invention

One or more embodiments described herein relate to a memory device and a method of operating a memory device.

Description of Related Art

A storage device stores data in a memory device under control of a host. In some cases, the storage device may include a memory controller that controls the memory device.

The memory device is classified into a volatile memory device or a nonvolatile memory device. A volatile memory device may store data only when supplied with power from a power supply. When the supply of power is interrupted, data stored in the volatile memory device may disappear. Examples of a volatile memory device include a Static Random Access Memory (SRAM) and a Dynamic Random Access Memory (DRAM).

A nonvolatile memory device stores data even when the supply of power is interrupted. Examples of a nonvolatile memory device include a Read Only Memory (ROM), a Programmable ROM (PROM), an Electrically Programmable ROM (EPROM), an Electrically Erasable ROM (EEROM), and a flash memory.

SUMMARY

Embodiments provide a memory device for improving performance by decreasing a time at which a program operation is completed while decreasing a peak current flowing through a bit line, and an operating method of the memory device.

In accordance with an aspect of the present disclosure, there is provided a memory device including: a plurality of memory cells, a plurality of page buffers each coupled to corresponding memory cells through a plurality of bit lines, and configured to temporarily store data to be respectively stored in the plurality of memory cells and a page buffer controller configured to control one or more voltages to be applied to the plurality of bit lines in a program operation of storing the data in the plurality of memory cells, wherein the program operation includes a plurality of program loops, each including a program voltage apply operation and a verify operation, the program voltage apply operation includes a precharge period, a program voltage apply period, and a discharge period, the plurality of page buffers are configured to provide a bit line voltage to the plurality of bit lines in response to a page buffer sensing signal output from the page buffer controller, and the page buffer controller includes: a first signal provider configured to provide a first pulse signal as the page buffer sensing signal during a first period in the precharge period, the first pulse signal having a first voltage level greater than a ground voltage; and a second signal provider configured to provide a second pulse signal as the page buffer sensing signal after the first period, the second pulse signal increasing from the first voltage level to a second voltage level with a slope determined according to a loop count of the plurality of program loops, the slope corresponding to one of a plurality of predetermined slopes.

In accordance with another aspect of the present disclosure, there is provided a memory device including: a plurality of memory cells; a plurality of page buffers each coupled to corresponding memory cells through a plurality of bit lines, and configured to temporarily store data in respective ones of the plurality of memory cells; and a page buffer controller configured to control one or more voltages to be applied to the plurality of bit lines in a program operation of storing the data in the plurality of memory cells, wherein the program operation includes a plurality of program loops, each including a program voltage apply operation and a verify operation, the program voltage apply operation includes a precharge period, a program voltage apply period, and a discharge period, the plurality of page buffers are configured to provide a bit line voltage to the plurality of bit lines in response to a page buffer sensing signal output from the page buffer controller, and the page buffer controller includes: a first signal provider configured to provide a first pulse signal as the page buffer sensing signal during a first period in the precharge period, the first pulse signal having a first voltage level higher than a ground voltage; and a second signal provider configured to provide a step signal as the page buffer sensing signal after the first period, the step signal increasing from the first voltage level to a second voltage level based on a step voltage, the step voltage corresponding to a loop count of the plurality of program loops among a plurality of predetermined step voltages.

In accordance with still another aspect of the present disclosure, there is provided a method for operating a memory device the method including: providing a first pulse signal to a page buffer during a first period, the pulse signal serving as a page buffer sensing signal having a first voltage level higher than a ground voltage; providing the page buffer with a ramp signal after the first period, the ramp signal serving as the page buffer sensing signal and increasing from the first voltage level to a second voltage level with a slope determined based on a loop count of a plurality of program loops, the slope corresponding to one of a plurality of predetermined slopes; providing the page buffer with a second pulse signal after the ramp signal reaches the second voltage level, the second pulse signal serving as the page buffer sensing signal and having a third voltage level higher or equal to the second voltage level; and applying a program voltage to a word line commonly connected to a plurality of memory cells.

In accordance with still another aspect of the present disclosure, there is provided a memory device including: a plurality of memory cells; a voltage generator configured to generate operating voltages for a program operation of storing data in the plurality of memory cells; a plurality of page buffers respectively connected to the plurality of memory cells through a plurality of bit lines, the plurality of page buffers providing a bit line voltage to the plurality of bit lines in response to a page buffer sensing signal; and a page buffer controller configured to provide the page buffer sensing signals to the plurality of page buffers in the program operation, wherein the page buffer controller` includes: a first signal provider configured to provide a pulse signal serving as the page buffer sensing signal during a first period, the pulse signal generated by the voltage generator; and a second signal provider configured to provide a ramp signal as the page buffer sensing signal during a second period after the first period, the ramp signal having a slope determined based on a loop count of a program loop which represents a degree to which the program operation is performed, and the second signal provider including a plurality of switches provided with a page buffer pump voltage; a plurality of transistors grouped and connected in series to the plurality of switches, the plurality of transistors configured to output a bias current from the plurality of switches in response to a voltage control signal, the voltage control signal provided based on the loop count of the program loop; a capacitor commonly connected to the plurality of transistors and configured to charge a capacitor voltage with respect to the bias current; and a voltage output circuit commonly connected to the plurality of transistors and configured to transfer a capacitor voltage corresponding to the page buffer sensing signal.

In accordance with still another aspect of the present disclosure, there is provided a page buffer controller including: a controller configured to control sensing signals for one or more page buffers in a program operation, the one or more page buffers providing a bit line voltage to at least one bit line, wherein the sensing signals include a first signal provided by the controller, during a first period of a precharge period, the first signal having a first voltage level greater than a ground voltage; and a second signal provided by the controller, during a second period occurring after the first period in the precharge period, the second signal increasing from the first voltage level to a second voltage level with one of a plurality of predetermined slopes corresponding to a loop count of program loops for the program operation, wherein: when the loop count is equal to or less than a first reference count or when the loop count is greater than a second reference count which is greater than the first reference count, the second signal is configured to increase with a first slope during the second period; and when the loop count is greater than the first reference count and equal to or less than the second reference count, the second signal is configured to increase with a second slope less than the first slope, during a third period which is longer than the second period in the precharge period.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
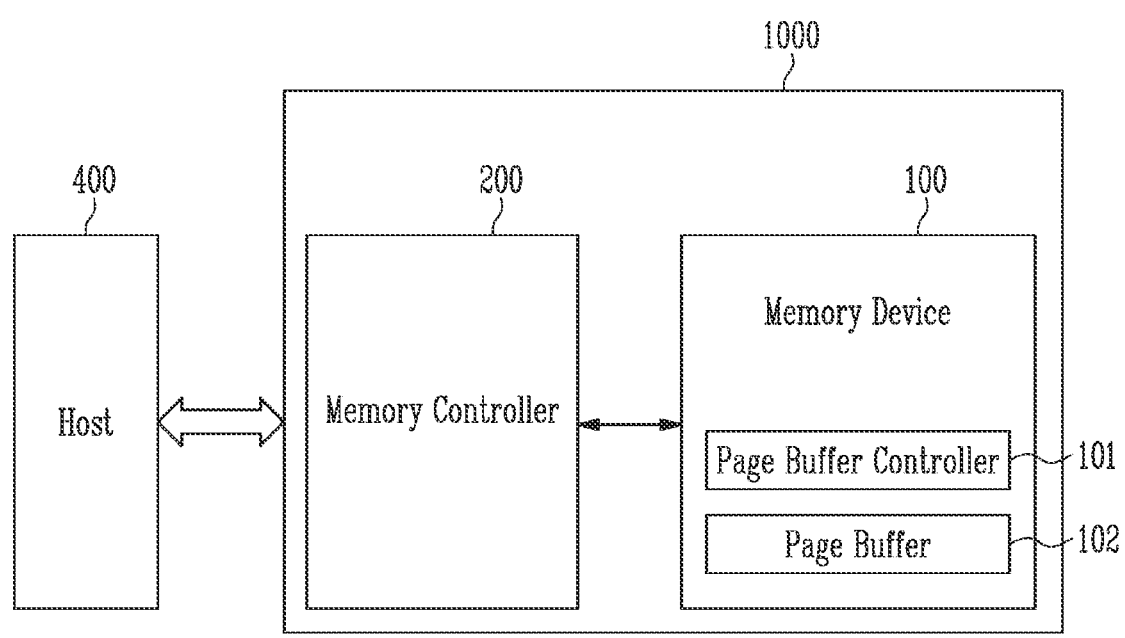
FIG. 1 illustrates an embodiment of a storage system.

FIG. 1 is a diagram illustrating a storage system in accordance with an embodiment. Referring to FIG. 1, the storage system may be implemented as a data processing system including, for example, a personal computer (PC), a data center, and an enterprise type data storage system, and a direct attached storage (DAS), a data processing system including a storage area network (SAN), a data processing system including a network attached storage, or the like.

The storage system may include a storage device 1000 and a host 400. The storage device 1000 may be a device for storing data according to a request of the host 400. Examples of the host 400 include a mobile phone, a smart phone, an MP3 player, a laptop computer, a desktop computer, a game console, a TV, a tablet PC or an in-vehicle infotainment system.

The storage device 1000 may be one of various types of storage devices, for example, according to a host interface that corresponds to a communication scheme of the host 400. Examples of the storage device 1000 include a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), and a memory stick.

The storage device 1000 may be manufactured to have various kinds of package types. Examples include a Package-On-Package (POP), a System-In-Package (SIP), a System-On-Chip (SOC), a Multi-Chip Package (MCP), a Chip- On-Board (COB), a Wafer-level Fabricated Package (WFP), and a Wafer-level Stack Package (WSP).

The storage device 1000 may include a memory device 100 and a memory controller 200. The memory device 100 may operate under the control of the memory controller 200. Specifically, the memory device 100 may receive a command and an address from the memory controller 2000, and access a memory cell selected by the address among memory cells. The memory device 100 may perform an operation indicated by the command on the memory cell selected by the address.

The command may be, for example, a program command, a read command, or an erase command. The operation indicated by the command may be, for example, a program operation (or write operation), a read operation, or an erase operation.

The program operation may be an operation in which the memory device 100 stores write data provided from the host 400 under the control of the memory controller 200. For example, the memory device 100 may receive a program command, an address, and data, and program the data in a memory cell selected by the address. The data to be programmed in the selected memory cell may be considered write data.

The read operation may be an operation in which the memory device 100 reads read data stored in the memory device 100 under the control of the memory controller 200. For example, the memory device 100 may receive a read command and an address, and read data from an area selected by the address in a memory cell array. The data to be read from the selected area among data stored in the memory device 100 may be defined as read data.

The erase operation may be an operation in which the memory device 100 erases data stored in the memory device 100 under the control of the memory controller 200. For example, the memory device 100 may receive an erase command and an address, and erase data stored in an area selected by the address.

The memory device 100 may be implemented as a volatile memory device or a nonvolatile memory device. Examples of the volatile memory device include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), and the like.

Examples of the nonvolatile memory device may include a flash memory. The flash memory may include a NAND flash memory, a vertical NAND flash memory, a NOR flash memory, and the like. In some embodiments, for convenience of description, it is assumed that memory device 100 is a NAND flash memory.

The memory device 100 may store write data under the control of the memory controller 200 or may read stored read data and provide the read data to the memory controller 200.

The memory device 100 may include a plurality of dies. One die may include at least one plane. One plane may include a memory cell array including memory cells for storing write data. The memory cell array may include a plurality of memory blocks. A memory block may be a unit for performing an erase operation of erasing data. The memory block may include a plurality of pages. A page may be a unit for performing a program operation of storing write data or a read operation of reading stored read data.

The memory block may include a plurality of memory cells. Each memory cell may have an erase state as a target state or may have one state among a plurality of program states as a target state according to whether a program operation is to be performed. Each memory cell may have a target state for every plurality of memory cells.

The program operation may be an operation of storing data in a plurality of memory cells. For example, the program operation may be an operation of increasing threshold voltages of selected memory cells among the plurality of memory cells, such that each of the threshold voltages of the selected memory cells is included in each target state. Embodiments of these features will be described with reference to FIGS. 4 to 7.

A number of the plurality of program states may be determined according to a bit number of data stored in a memory cell. For example, in the case of a memory cell storing 3-bit data, the number of the plurality of program states may be 7. The number of store bits of data and/or the number of program states may be different in other embodiments. Embodiments of these features will be described with reference to FIG. 7.

The target state among the plurality of program states and the erase state to which a memory cell is to be programmed may be determined according to data to be stored in the memory cell.

The memory device 100 may include a page buffer controller 101 and a page buffer 102. The page buffer controller 101 may control a voltage to be applied to a plurality of bit lines in a program operation. The voltage to be applied to the plurality of bit lines may be a bit line voltage. The bit line voltage may be, for example, a program allow voltage or a program inhibit voltage.

In an embodiment, the page buffer controller 101 may provide a page buffer sensing signal to the page buffer 102, in order to provide the bit line voltage to the plurality of bit lines. Embodiments will be described with reference to FIGS. 2 to 14.

In an embodiment, a page buffer control signal may be implemented, for example, as a pulse signal having a constant voltage level, a ramp signal having a positive slope, a step signal increasing according to a step voltage, or another type of signal. Some embodiments will be described with reference to FIGS. 12 to 14.

The page buffer 102 may be connected to a plurality of memory cells through a bit line. The page buffer 102 may temporarily store data to be stored in the plurality of memory cells. In one embodiment, a plurality of page buffers 102 may be provided. The one or more page buffers 102 may be connected to a plurality of memory cells through a plurality of bit lines, respectively. The plurality of page buffers 102 may temporarily store data to be respectively stored in the plurality of memory cells.

In an embodiment, the page buffer 102 may provide the bit line voltage to the bit line in response to the page buffer sensing signal. For example, the plurality of page buffer 102 may provide the bit line voltage to the plurality of bit lines in response to the page buffer sensing signal from the page buffer controller 101.

The memory controller 200 may control overall operations of the storage device 1000. When power is applied to the storage device 1000, the memory controller 200 may execute instructions (e.g., firmware).

When the memory device 100 is a flash memory device, the instructions may correspond to firmware that includes a host interface layer, a flash translation layer, and a flash interface layer. The host interface layer may control an operation between the host 400 and the memory controller 200. The flash translation layer may translate a logical address provided from the host 400 into a physical address. The flash interface layer may control communication between the memory controller 200 and the memory device 100.

The memory controller 200 may control the memory device 100 to perform a program operation, a read operation, and an erase operation respectively in response to a write request, a read request, and an erase request of the host 400. In the program operation, the memory controller 200 may provide the memory device 100 with a program command, a physical address, and write data. In the read operation, the memory controller 200 may provide the memory device 100 with a read command and a physical address. In the erase operation, memory controller 200 may provide memory device 100 with an erase command and a physical address.

The memory controller 200 may autonomously generate a command, an address, and data regardless of any request from the host 400. The memory controller 200 may transmit the command, the address, and the data, which are autonomously generated, to the memory device 100.

For example, the memory controller 200 may generate a command for performing a background operation, an address, and data. Also, the memory controller 200 may provide the memory device 100 with the command, the address, and the data. The background operation may be at least one of wear leveling, read reclaim, and garbage collection.

Wear leveling may correspond, for example, to static wear leveling, dynamic wear leveling, etc. The static wear leveling may include an operation of storing a number of times memory blocks are erased and moving cold data in which an erase operation or a write operation hardly occurs to a memory block which is erased a largest number of times. Dynamic wear leveling may include an operation of storing a number of times memory blocks are erased, and programing data in a memory block which is erased a smallest number of times.

Read reclaim may include an operation of moving data stored in a memory block to another memory block before an uncorrectable error occurs in the data stored in the memory block.

Garbage collection may include an operation of copying valid data included in a bad block among memory blocks to a free block, and erasing invalid data included in the bad block. Copying the valid data in the bad block to the free block may indicate that the valid data in the bad block is moved to the free block.

The storage device 1000 may further include a buffer memory. In an embodiment, the buffer memory may be in the memory controller 200. Examples of the buffer memory include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), and a Spin Transfer Torque Random Access Memory (STT-RAM).

The memory controller 200 may control two or more memory devices 100. The memory controller 200 may control the memory devices 100, for example, according to an interleaving technique in order to improve operational performance. The interleaving technique may control operations on two or more memory devices 100 to overlap with each other. The memory controller 200 may control the memory devices 100 using a different technique in another embodiment.

The host 400 may communicate with the storage device 1000 through an interface. Examples of the interface include a serial advanced technology attachment (SATA) interface, a SATA express (SATAe) interface, a serial attached small computer system interface (SAS) interface, a peripheral component interconnect express (PCIe) interface, a non-volatile memory express (NVMe) interface, an advanced host controller interface (AHCI) interface, or a multimedia card interface. The interface may be another type of interface in other embodiments.

The host 400 may store write data in the storage device 1000 or may communicate with the storage device 1000 to acquire read data stored in the storage device 1000. In an embodiment, the host 400 may provide the storage device 1000 with a write request for requesting the storage device 1000 to store write data. Also, the host 400 may provide the storage device 1000 with a write request, write data, and a logical address for identifying the write data.

The storage device 1000 may store the write data provided by the host 400 in the memory device 100 and may provide the host 400 with a response that the storing of the write data has been completed, in response to the write request provided from the host 400.

In an embodiment, the host 400 may provide the storage device 1000 with a read request for requesting the storage device 1000 to provide data stored in the storage device 1000 to the host 400. Also, the host 400 may provide a read request and a read address to the storage device 1000.

The storage device 1000 may read, from the memory device 100, read data corresponding to the read address provided by the host 400 and may provide the host 400 with the read data as a response to the read request, in response to the read request provided from the host 400.

Figure 2:
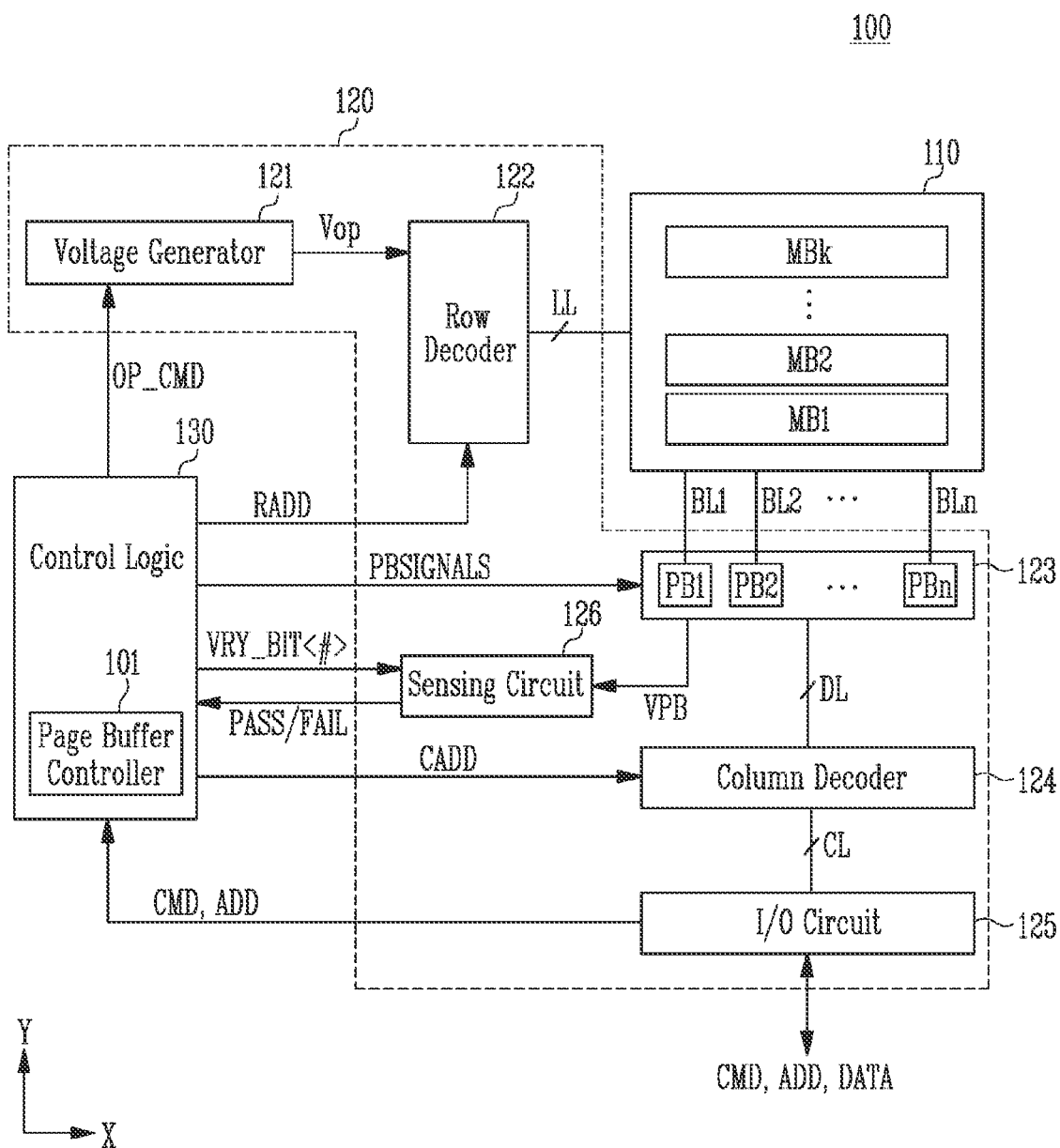
FIG. 2 illustrates an embodiment of a memory device.

FIG. 2 illustrates an embodiment of a memory device 100 which includes a memory cell array 110, a peripheral circuit 120, and a control logic 130. The memory cell array 110 may include a plurality of memory blocks MB1 to MBk (k is a positive integer). The number of memory blocks MB1 to MBk shown may be different in another embodiment.

Each of the memory blocks MB1 to MBk may be connected to local lines LL and bit lines BL1 to BLn (n is a positive integer). The local lines LL may be connected to a row decoder 122 and may be connected to each of the memory blocks MB1 to MBk. The local lines LL may include a first select line, a second select line, and a plurality of word lines arranged between the first select line and the second select line. The local lines LL may further include dummy lines between the first select line and the word lines, dummy lines between the second select line and the word lines, and pipe lines.

The bit lines BL1 to BLn may be commonly connected to the memory blocks MB1 to MBk.

The memory blocks MB1 to MBk may be implemented in a two-dimensional or three-dimensional structure. For example, memory cells in the memory blocks MB1 to MBk having the two-dimensional structure may be arranged in a direction parallel to a substrate. In one embodiment, memory cells in the memory blocks MB1 to MBk having the three-dimensional structure may be stacked in a direction vertical to a substrate.

The peripheral circuit 120 may include a voltage generator 121, the row decoder 122, a page buffer group 123, a column decoder 124, an input/output circuit 125, and a sensing circuit 126. The voltage generator 121 may generate various operating voltages Vop for a program operation, a read operation, and an erase operation in response to an operation command OP_CMD. Also, the voltage generator 121 may selectively discharge the local lines LL in response to the operation command OP_CMD. For example, the voltage generator 121 may generate a program voltage, a verify voltage, pass voltages, a turn-on voltage, a read voltage, an erase voltage, a source line voltage, a precharge voltage, a page buffer pump voltage, a core voltage or power voltage, a mirror voltage, a reference voltage, and/or other voltages, under the control of the control logic 130.

In an embodiment, the voltage generator 121 may generate an internal power voltage by regulating external power voltage. The internal power voltage may be used, for example, as an operating voltage of the memory device 100. In an embodiment, the voltage generator 121 may generate a plurality of voltages using the external power voltage or the internal power voltage. The voltage generator 121 may include a plurality of pumping capacitors for receiving the internal power voltage, and may generate a plurality of voltages by selectively activating the plurality of pumping capacitors under the control of the control logic 130. The plurality of generated voltages may be supplied to the memory cell array 110 by the row decoder 122.

The row decoder 122 may transfer the operating voltages Vop to the local lines LL in response to a row address RADD. The operating voltages Vop may be transferred to a selected memory block among the memory blocks MB1 to MBk through the local lines LL. For example, in a program operation, the row decoder 122 may apply a program voltage to a selected word line and may apply a program pass voltage (e.g., having a level different from (e.g., lower than) that of the program voltage) to unselected word lines. In a program verify operation, the row decoder 122 may apply a verify voltage to the selected line and may apply a verify pass voltage (e.g., different from (e.g., higher than) the verify voltage) to the unselected word lines.

In a read operation, the row decoder 122 may apply a read voltage to the selected word line and may apply a read pass voltage (e.g., different from (e.g., higher than) the read voltage) to the unselected word lines.

In an erase operation, the row decoder 122 may select one memory block according to a decoded address. In the erase operation, the row decoder 122 may apply a ground voltage to word lines connected to the selected memory block.

The page buffer group 123 may include first to nth page buffers PB1 to PBn connected to the memory cell array 110 through respective first to nth bit lines BL1 to BLn. The first to nth page buffers PB1 to PBn may operate under the control of the control logic 130. For example, the first to nth page buffers PB1 to PBn may operate in response to page buffer control signals PBSIGNALS. In one embodiment, the first to nth page buffers PB1 to PBn may temporarily store data received through the first to nth bit lines BL1 to BLn, or may sense a voltage or current of the bit lines BL1 to BLn in a read operation or a verify operation.

In a program operation, the first to nth page buffers PB1 to PBn may provide a bit line voltage to the first to nth bit lines BL1 to BLn in response to the page buffer control signals PBSIGNALS. The bit line voltage may be, for example, a program allow voltage or a program inhibit voltage. When the program voltage is applied to the selected word line, the first to nth page buffers PB1 to PBn may receive data DATA through the column decoder 124 and the input/output circuit 125. The first to nth page buffers PB1 to PBn may temporarily store the received data DATA and may transfer the temporarily stored data DATA to selected memory cells through the first to nth bit lines BL1 to BLn. Memory cells of a selected page are programmed according to the transferred data DATA. A memory cell connected to a bit line to which the program allow voltage (e.g., a ground voltage) is applied may have an increased threshold voltage. A threshold voltage of a memory cell connected to a bit line to which the program inhibit voltage (e.g., a power voltage) is applied may be maintained.

In a verify operation, the first to nth page buffers PB1 to PBn may sense data stored in selected memory cells through the first to nth bit lines BL1 to BLn.

In a read operation, the first to nth page buffers PB1 to PBn may sense data DATA stored in selected memory cells through the first to nth bit lines BL1 to BLn, and may output the sensed data DATA to the input/output circuit 125 under the control of the column decoder 124.

In an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the page buffers PB1 to PBn through data lines DL or may exchange data with the input/output circuit 125 through column lines CL.

The input/output circuit 125 may transfer a command CMD and an address ADD (which are transferred from the memory controller 200) to the control logic 130 or may exchange data DATA to column decoder 124.

In a read operation or a verify operation, the sensing circuit 126 may generate a reference current in response to an allow bit VRY_BIT<#>, and may output a pass signal PASS or a fail signal FAIL by comparing a sensing voltage VPB from the page buffer group 123 with a reference sensing voltage generated by the reference voltage.

The control logic 130 may control the peripheral circuit 120 by outputting the operation command OP_CMD, the row address RADD, the page buffer control signal PBSIGNALS, and the allow bit VRY_BIT<#> in response to the command CMD and the address ADD. In an embodiment, a page buffer sensing signal, a current sensing signal, a sense amp precharge signal, a sensing node precharge signal, a sense amp sensing signal, a sense amp discharge signal, and/or other signals, may be included in the page buffer control signals PBSIGNALS. Examples will be described with reference to FIGS. 9 to 11.

In an embodiment, the control logic 130 may include a page buffer controller 101. In an embodiment, in a program operation, the page buffer controller 101 may provide a pulse signal having a first voltage level as a page buffer sensing signal. After the pulse signal having the first voltage level is provided as the page buffer sensing signal, the page buffer controller 101 may provide a ramp signal as the page buffer sensing signal. The ramp signal may increase from the first voltage level to a second voltage level, as described with reference to FIGS. 12 to 14.

In one embodiment, in a program operation, the page buffer controller 101 may provide a pulse signal having a first voltage level as a page buffer sensing signal. After the pulse signal having the first voltage level is provided as the page buffer sensing signal, the page buffer controller 101 may provide, as the page buffer sensing signal, a step signal increasing based on one or more steps from the first voltage level to a second voltage level according to a constant step voltage. Embodiments will be described with reference to FIGS. 12 to 14.

Figure 3:
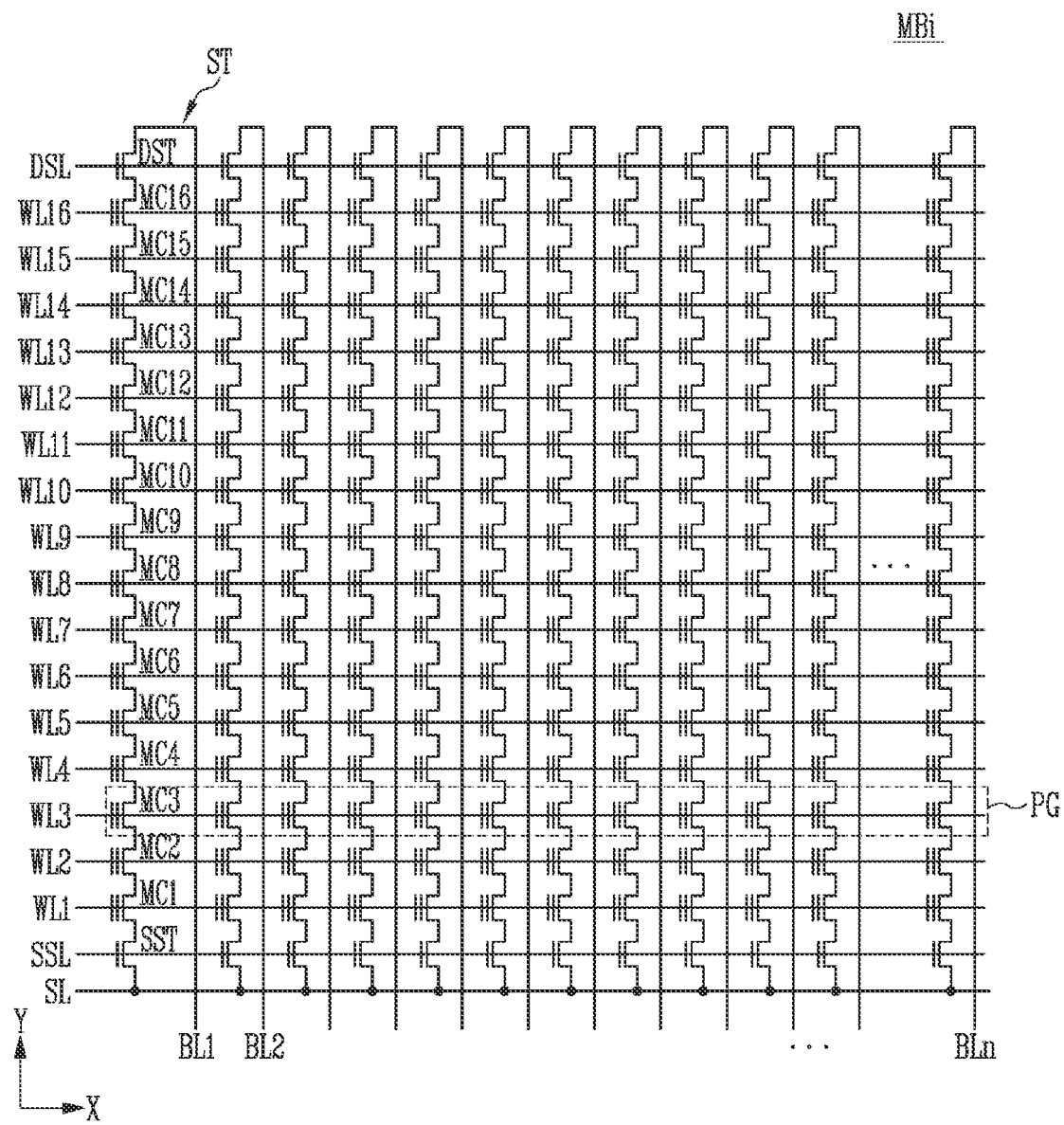
FIG. 3 illustrates an embodiment of a memory block.

FIG. 3 is a diagram illustrating an embodiment of a memory block MBi which may be representative of the memory blocks MB1 to MBk shown in FIG. 2.

Referring to FIG. 3, the memory block MBi may include a first select line, a second select line, a plurality of word lines WL1 to WL16, a source line SL, a plurality of bit lines BL1 to BLn, and a plurality of strings ST. The first select line may be, for example, a source select line SSL. Hereinafter, it is assumed that the first select line is the source select line SSL. The second select line may be, for example, a drain select line DSL. Hereinafter, it is assumed that the second select line is the drain select line DSL. The plurality of word lines WL1 to WL16 may be arranged in parallel to each other between the source select line SSL and the drain select line DSL. The number of word lines WL1 to WL16 shown in FIG. 3 is merely illustrative and may be a different number in another embodiment.

The source line SL may be commonly connected to the plurality of strings ST. The plurality of bit lines BL1 to BLn may be respectively connected to the strings ST. Also, the plurality of strings ST may be connected to the bit lines BL1 to BLn and the source line SL. The strings ST may be configured identically to one another, and therefore a string ST connected to a first bit line BL1 will be described as an example.

The string ST may include a plurality of memory cells MC1 to MC16, at least one first select transistor, and at least one second select transistor. The plurality of memory cells MC1 to MC16 may be connected in series to each other between a source select transistor SST and a drain select transistor DST. Gate electrodes of the memory cells MC1 to MC16 may be respectively connected to the plurality of word lines WL1 to WL16. Therefore, the number of the plurality of memory cells MC1 to MC16 included in one string ST may be equal to that of the plurality of word lines WL1 to WL16.

One or more of the memory cells among the plurality of memory cells MC1 to MC16 may be configured, for example, as a Single Level Cell (SLC) storing 1-bit data, a Multi-Level Cell (MLC) storing 2-bit data, a Triple Level Cell (TLC) storing 3-bit data, and a Quadruple Level Cell (QLC) storing 4-bit cell. However, the present disclosure is not limited thereto, and the memory cell may store 5 or more-bit data.

A group of memory cells connected to the same word line among memory cells included in different strings ST may be referred to as a physical page PG. Therefore, the memory block MBi may include a number of physical pages PG corresponding to that of the word lines WL1 to WL16. Hereinafter, it is assumed that the memory cells (e.g., MC3) in the physical page PG are selected memory cells.

The first select transistor may be, for example, the source select transistor SST. Hereinafter, it is assumed that the first select transistor is the source select transistor SST.

The source select transistor SST may have a first electrode connected to the source line SL and a second electrode connected to a first memory cell MC1, among the plurality of memory cells MC1 to MC16. A gate electrode of the source select transistor SST may be connected to the source select line SSL.

The second select transistor may be, for example, the drain select transistor DST. Hereinafter, it is assumed that the second select transistor is the drain select transistor DST.

The drain select transistor DST may have a first electrode connected to a sixteenth memory cell MC16 (among the plurality of memory cells MC1 to MC16) and a second electrode connected to the first bit line BL1. A gate electrode of the drain select transistor DST may be connected to the drain select line DSL.

A program allow voltage may be applied to some bit lines among the plurality of bit lines BL1 to BLn. A program inhibit voltage may be applied to the other bit lines among the plurality of bit lines BL1 to BLn. A parasitic capacitor may be generated between the bit lines. A voltage charged in the parasitic capacitor may become higher as the difference between voltages respectively applied to the plurality of bit lines BL1 to BLn becomes larger. A peak current flowing through the bit line may become larger as the voltage charged in the parasitic capacitor becomes higher.

For example, the program allow voltage may be applied to the first bit line BL1 and the program inhibit voltage may be applied to the second bit line BL2. A first parasitic capacitor may be generated between the first bit line BL1 and the second bit line BL2 to which voltages (e.g., the program allow voltage and the program inhibit voltage having different voltage levels) are respectively applied.

In one example, the program allow voltage or the program inhibit voltage may be applied to each of the first bit line BL1 and the second bit line BL2. A second parasitic capacitor may be generated between the first bit line BL1 and the second bit line BL2 to which a voltage (e.g., the program allow voltage or the program inhibit voltage having the same voltage level) is applied. In one embodiment, the voltage level of a voltage charged in the first parasitic capacitor may be different from (e.g., higher than) that of a voltage charged in the second parasitic capacitor.

Figure 4:
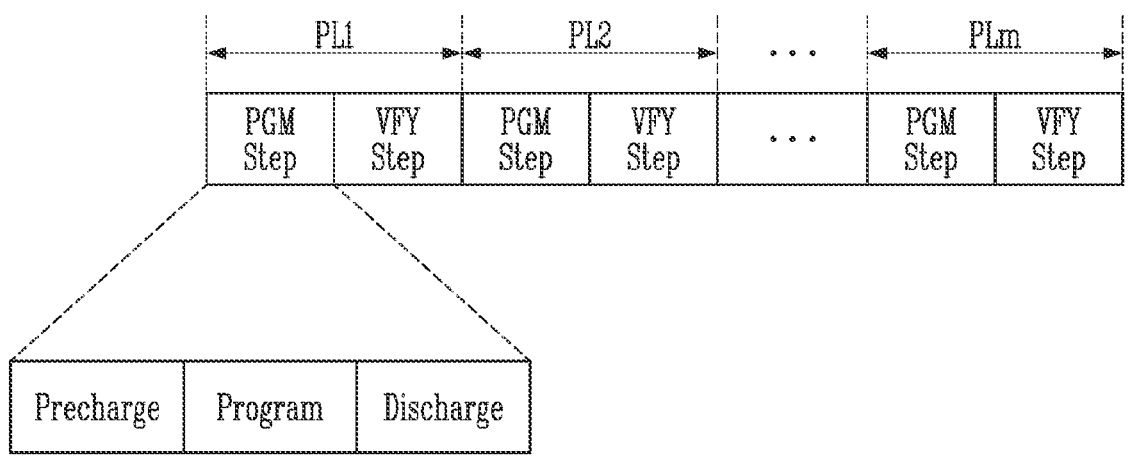
FIG. 4 illustrates an embodiment of a program operation.

FIG. 4 is a diagram conceptually illustrating an embodiment of a program operation of the memory device 100.

Referring to FIGS. 1, 2, and 4, the memory device 100 may perform a program operation. The program operation may include a plurality of program loops PL1 to PLm. Each program loop may include a program voltage apply step PGM Step and a verify step VFY Step. Whenever the program operation is performed, the program voltage apply step PGM Step and the verify step VFY Step (which are included in each program loop) may be performed. The degree to which the program operation is performed may be checked through a degree to which the program loop is repeated.

The program voltage apply step PGM Step may be a step of applying a program voltage to a selected word line as a word line commonly connected to selected memory cells. The program voltage apply step PGM Step included in each program loop may include a precharge period Precharge, a program period Program, and a discharge period Discharge. In this specification, the "program voltage apply step" and a "program voltage apply operation" may have the same meaning.

In the precharge period Precharge, an operation may be performed to set a bit line voltage as a voltage applied to a plurality of bit lines. The operation of setting the bit line voltage may be referred to as a "bit line setup operation." In an embodiment, the bit line voltage may be a program allow voltage or a program inhibit voltage. The program allow voltage may be, for example, a ground voltage. The program inhibit voltage may be, for example, a power voltage.

The program period Program may be a period in which a selected memory cell is programmed to have a threshold voltage corresponding to a program state. For example, the control logic 130 may control the voltage generator 121 and the row decoder 122 to apply the program voltage to the selected word line. Also, the control logic 130 may control the voltage generator 121 and the row decoder 122 to apply a program pass voltage (e.g., having a level lower than that of the program voltage) to unselected word lines.

When a program pulse is applied to the selected word line in the program period Program, a threshold voltage of a memory cell connected to a bit line to which the program allow voltage is applied may be increased. Also, a threshold voltage of a memory cell connected to a bit line to which the program inhibit voltage is applied may be maintained in the program period Program.

The discharge period Discharge may be a period in which voltages applied to word lines and select lines are discharged. The control logic 130 may control the voltage generator 121 and the row decoder 122 to apply the ground voltage corresponding to 0V to the word lines and select lines. The voltages applied to the word lines and the select lines may be discharged.

The verify step VFY Step may be an operation of determining whether a threshold voltage of a memory cell has reached a threshold voltage corresponding to a target state. Also, the verify step VFY Step may be an operation of determining whether selected memory cells have been programmed by applying verifying voltages. In one embodiment, the "verify step" and a "verify operation" may have the same meaning.

In the verify step VFY Step, a verify voltage for verifying a target state may be applied to the selected word line. When threshold voltages of a predetermined number of memory cells (among memory cells having the same target state) are higher than the verify voltage, the verify step VFY Step may pass. When each of the threshold voltages of the predetermined number of memory cells (among the memory cells having the same target state) is equal to or lower than the verify voltage, the verify step VFY Step may fail.

When verification on all target states passes, it may be determined that the program operation has passed. When the program operation does not pass within a predetermined reference time, it may be determined that the program operation has failed. When the program operation does not pass until a program loop corresponding to a predetermined maximum loop count is performed, it may be determined the program operation has failed.

Figure 5:
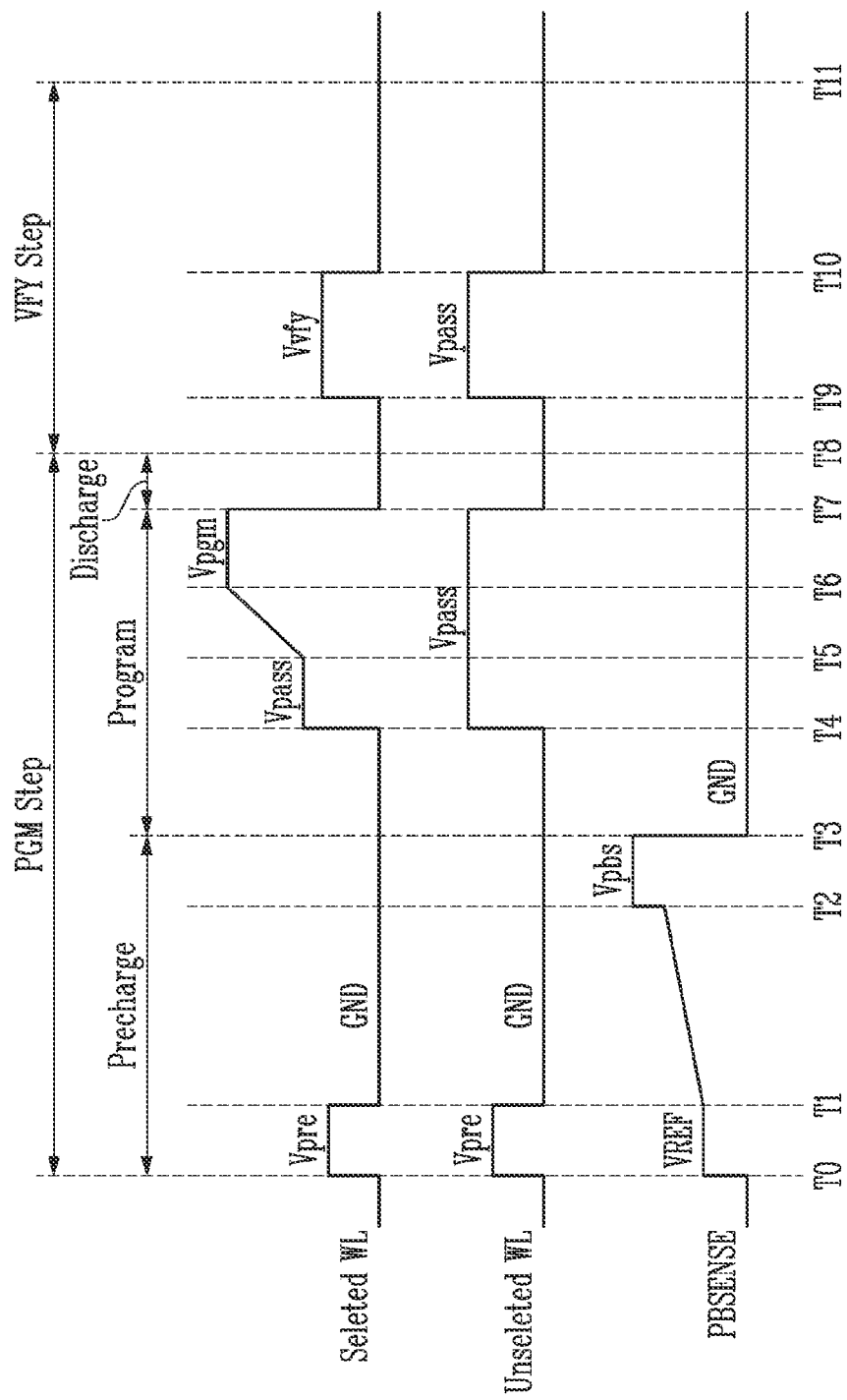
FIG. 5 illustrates an embodiment of a program operation.

FIG. 5 is a waveform diagram illustrating a program operation of the memory device in accordance with an embodiment.

Referring to FIGS. 1, 2, 4, and 5, a program voltage apply step PGM Step may be performed from T0 to T8, and a verify step VFY Step may be performed from T8 to T11. In one embodiment, a verify step VFY Step may be performed before T0.

The program voltage apply step PGM Step may include a precharge period Precharge, a program period Program, and a discharge period Discharge. For example, the precharge period Precharge may be from T0 to T3, the program period Program may be from T3 to T7, and the discharge period Discharge may be from T7 to T8.

At time T0, the control logic 130 may control the voltage generator 121 and the row decoder 122 to apply a precharge voltage Vpre to a selected word line Selected WL. Accordingly, a voltage level of the selected word line Selected WL may increase.

Also, at time T0, the control logic 130 may control the voltage generator 121 and the row decoder 122 to apply the precharge voltage Vpre to an unselected word line Unselected WL. Accordingly, the voltage level of the unselected word line Unselected WL may increase.

Also, at the time T0, the page buffer controller 101 may provide the page buffer 102 with a pulse signal having a voltage level of a reference voltage VREF as a page buffer sensing signal PBSENSE. When the pulse signal having the voltage level of the reference voltage VREF is provided to the page buffer 102, a peak current flowing through a bit line is prevented from being rapidly increased or the peak current flowing through the bit line is decreased, so that the time for which the program operation is completed can be decreased. An example will be described with reference to FIG. 9.

The reference voltage VREF may correspond to a threshold voltage of a page buffer sensing transistor according to an internal temperature of the memory device 100, a skew, or another parameter.

In an embodiment, the reference voltage VREF may be a sum of a bit line voltage and the threshold voltage of the page buffer sensing transistor. For example, when the bit line voltage is 0.35V and the threshold voltage of the page buffer sensing transistor is 0.8V, the reference voltage VREF may be 1.15V. These voltages may be different in other embodiments.

The length of a period from time T0 to time T1 (e.g., the length of a period in which a pulse signal having a voltage level of the reference voltage VREF is provided) may be changed according to characteristics of the page buffer sensing transistor in the page buffer 102.

At time T1, the control logic 130 may control the voltage generator 121 and the row decoder 122 to provide a ground voltage GND to the selected word line Selected WL and the unselected word line Unselected WL. The voltage level of the selected word line Selected WL and the voltage level of the unselected word line Unselected WL may decrease.

At time T1, the page buffer controller 101 may output a ramp signal as the page buffer sensing signal PBSENSE. The slope of the ramp signal may have various values. The time for the bit line to be precharged (or the time for the bit line to be set up) may be decreased as the slope of the ramp signal becomes steeper, e.g., as the slope of the ramp signal increases.

In an embodiment, when the slope of the ramp signal is relatively small, the page buffer sensing signal PBSENSE (as the ramp signal) may not reach the voltage level of a turn-on voltage Vpbs as a target voltage at time T2. As shown in FIG. 5, the page buffer controller 101 may provide the page buffer 102 with a pulse signal having the voltage level of the turn-on voltage Vpbs as the page buffer sensing signal PBSENSE, such that the page buffer sensing signal PBSENSE reaches the voltage level of the turn-on voltage Vpbs. When the pulse signal is provided so that the page buffer sensing signal PBSENSE reaches the voltage level of the turn-on voltage Vpbs, this may be considered a fully charged state.

In an embodiment, when the slope of the ramp signal is relatively large (e.g., above a predetermined value), the page buffer sensing signal PBSENSE as the ramp signal may reach the voltage level of the turn-on voltage Vpbs at time T2. The page buffer controller 101 may provide the page buffer 101 with the page buffer sensing signal PBSENSE, which maintains the voltage level of the turn-on voltage Vpbs.

The turn-on voltage Vpbs is a high voltage and may be a voltage sufficiently high to turn on the page buffer sensing transistor in the page buffer 102. Based on the turn-on voltage Vpbs, a phenomenon in which the bit line is precharged by an insufficient amount is prevented, so that reliability of programming can be improved and the speed of the program operation can be increased.

At time T3, the page buffer 102 may provide bit lines with a program allow voltage or a program inhibit voltage in response to the page buffer sensing signal PBSENSE, having the voltage level of the turn-on voltage Vpbs.

During a period in which the ramp signal is provided and a period in which the pulse signal having the voltage level of the turn-on voltage Vpbs is provided, a ground voltage may be provided to the selected word line Selected WL and the unselected word line Unselected WL. An example will be described with reference to FIG. 5. The period in which the ramp signal is provided may be a period from time T1 to time T2, and the period in which the pulse signal having the voltage level of the turn-on voltage Vpbs is provided may be a period from time T2 to time T3. From time T1 to time T3, the ground voltage may be provided to the selected word line Selected WL and the unselected word line Unselected WL.

At time T3, the precharge period Precharge may end, and the page buffer sensing signal PBSENSE (having a voltage level of the ground voltage GND) may be provided to the page buffer 102.

At time T4, the control logic 130 may control the voltage generator 121 and the row decoder 122 to provide a pass voltage Vpass to the word lines Selected WL and Unselected WL.

At time T5, the control logic 130 may control the voltage generator 121 and the row decoder 122 to provide a program voltage Vpgm to the selected word line Selected WL. The voltage level of the selected word line Selected WL may increase.

At the time T6, the voltage level of the selected word line Selected WL may increase from the voltage level of the pass voltage Vpass to the voltage level of the program voltage Vpgm.

During a period from time T4 to time T7, the voltage of the unselected word line Unselected WL may be maintained as the pass voltage Vpass.

At time T7, the program period Program may end and the control logic 130 may control the voltage generator 121 to discharge the word lines Selected WL and Unselected WL. For example, control logic 130 may control the voltage generator 121 to apply the ground voltage GND to the word lines Selected WL and Unselected WL.

At time T8, the discharge period Discharge may end.

At time T9, control logic 130 may control the voltage generator 121 and the row decoder 122 to apply a verify voltage Vvfy to the selected word line Selected WL. Also, control logic 130 may control the voltage generator 121 and the row decoder 122 to apply a verify pass voltage Vpass to the unselected word line Unselected WL.

The verify voltage Vvfy may be a voltage for determining a program state of each of selected memory cells. The verify pass voltage Vpass may be a voltage to allow memory cells connected to the unselected word line Unselected WL to become on-cells, such that the memory cells are not influenced by the voltage of the bit line.

At time T10, the control logic 130 may control the voltage generator 121 to discharge the word lines Selected WL and Unselected WL.

At the time T11, the verify step VFY Step may end.

Figure 6:
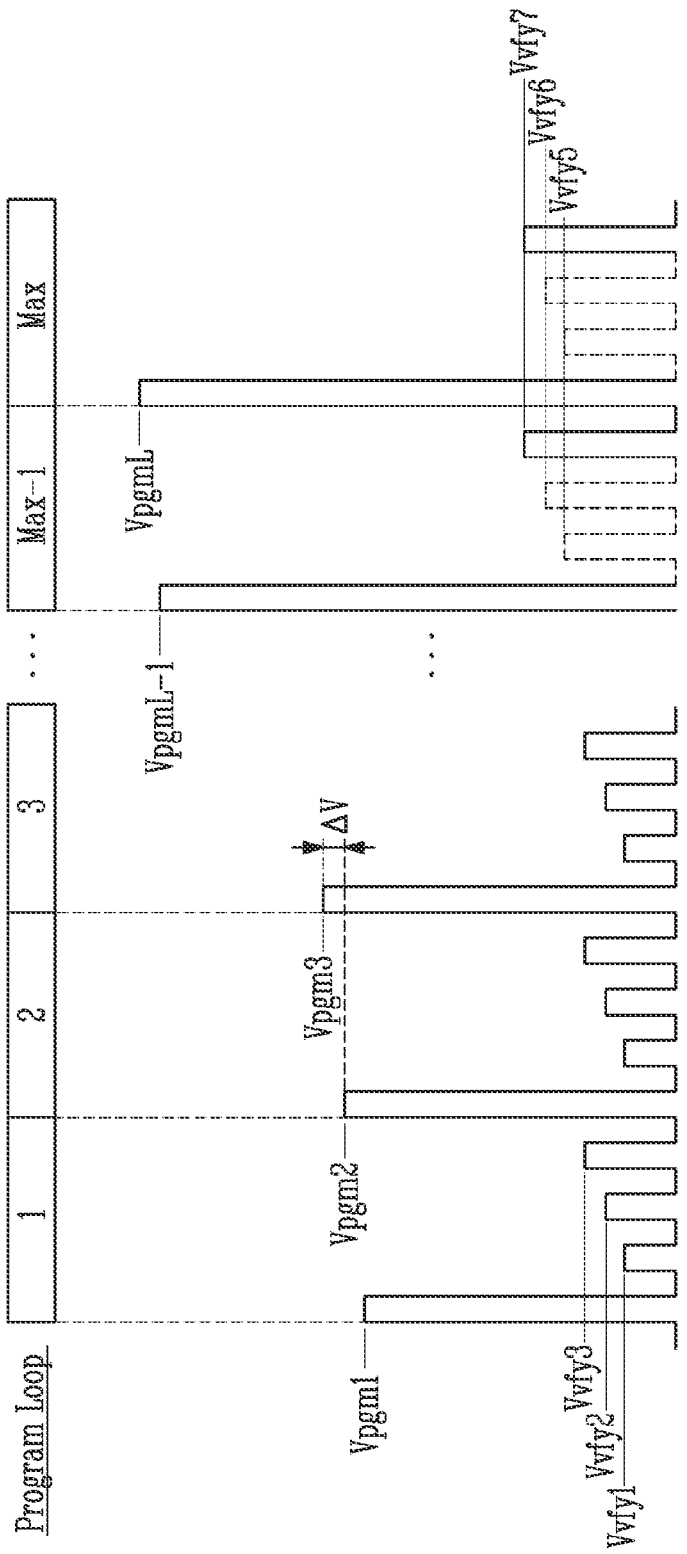
FIG. 6 illustrates an embodiment of a program and verify voltages.

FIG. 6 is a diagram illustrating a program voltage and a verify voltage in accordance with an embodiment. In the embodiment shown in FIG. 6, it is assumed that selected memory cells are TLCs.

Referring to FIGS. 5 and 6, the program operation may include a plurality of program loops. A value of each program loop may be loop count. For example, the value of a first program loop may be 1, the value of a second program loop may be 2, and the value of a third program loop may be 3.

Each program loop may include a program voltage apply step PGM Step and a verify step VFY Step. For example, the first program loop may include a first program voltage apply step of applying a first program voltage Vpgm1 and a first verify step of sequentially applying first to third verify voltages Vvfy1 to Vvfy3. For example, the second program loop may include a second program voltage apply step of applying a second program voltage Vpgm2 and a second verify step of sequentially applying the first to third verify voltages Vvfy1 to Vvfy3. In one embodiment, a (Max−1)th program loop may include an (L−1)th program voltage apply step of applying an (L−1)th program voltage VpgmL−1, and an (L−1)th verify step of sequentially applying fifth to seventh verify voltages Vvfy5 to Vvfy7, where L is a natural number.

A program voltage Vpgm may be provided according to an Incremental Step Pulse Program (ISPP) method. The program voltage Vpgm may increase by a predetermined step program voltage ΔV whenever the program loop is repeated. For example, the program voltage Vpgm may sequentially increase from the first program voltage Vpgm1 to an Lth program voltage VpgmL.

The number of verify voltages may be determined, for example, according to a number of a plurality of program states. An example will be described with reference to FIG. 6. When a memory cell is a TLC, the number of program states may be 7 and the number of the verify voltages Vvfy1 to Vvfy7 may be 7. However, the number of verify voltages and program states may be different in another embodiment.

The program voltages Vpgm1 to VpgmL and the verify voltages Vvfy1 to Vvfy7 may be repeated until a maximum program loop MAX is performed. Which program states are to be verified in a verify step in a specific program loop (e.g., which verify voltages are to be applied) may be predetermined, for example, according to an experiment conducted by considering the number of times erase and program operations that are performed before a product is released, a design, etc.

The speed at which selected memory cells are programmed may increase as the number of times the erase and program operations are performed increases. Therefore, which verify voltage is to be applied in a specific program loop may be set by considering characteristics of the memory cells based on the increase in the number of times the erase and program operations are performed.

An example will be described with reference to FIG. 6. From the first program loop to the third program loop, verification on first to third program states may be performed for each program loop. For example, from the first program loop to the third program loop, the first to third verify voltages Vvfy1 to Vvfy3 may be applied to a selected word line for each program loop.

Figure 7:
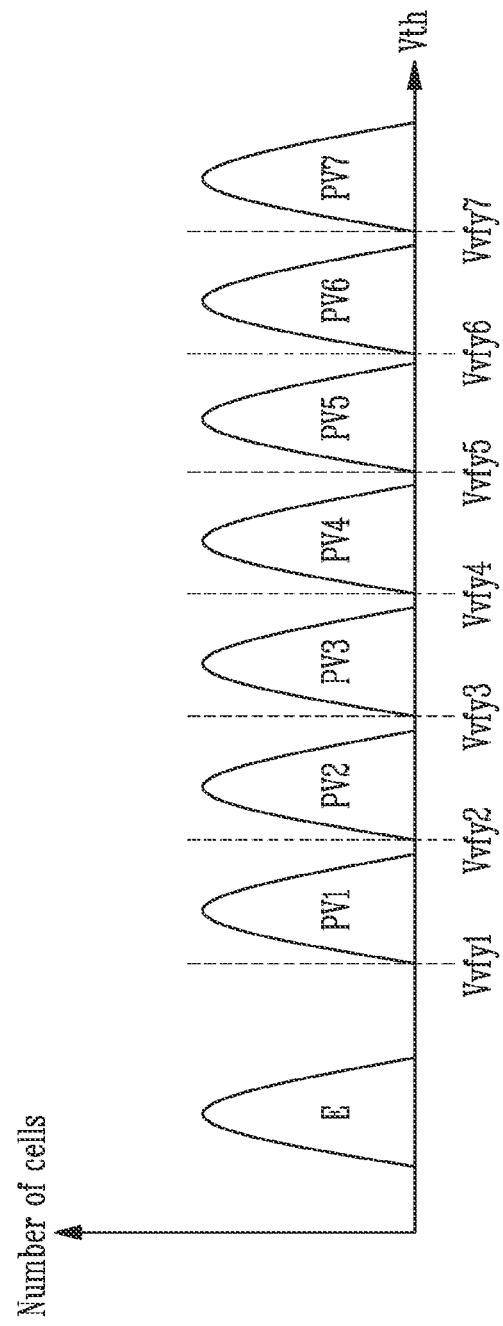
FIG. 7 illustrates an embodiment of an erase state and a plurality of program states.

FIG. 7 is a diagram illustrating an erase state and a plurality of program states in accordance with an embodiment. Which target state to which a memory cell is to be programmed (among the plurality of program states and the erase state) may be determined according to data stored in the memory cell. When the memory cell is an SLC, the target state may be an erase state E or a first program state PV1. When the memory cell is an MLC, the target state may be the erase state E or one of first to third program states PV1 to PV3. When the memory cell is a TLC, the target state may be the erase state E or one of first to seventh program states PV1 to PV7. These target states may differ in other embodiments.

In one embodiment, the number of program states may be determined according to the bit number of the data stored in the memory cell. When the memory cell is an SLC, the memory cell may be in the erase state E or the first program state PV1. Hence, the number of program states may be 1. When the memory cell is an MLC, the memory cell may be in the erase state E or any one of the first to third program states PV1 to PV3. Hence, the number of program states may be 3. When the memory cell is a TLC, the number of program states may be 7. For example, when the bit number is a (a is a natural number), the number of the plurality of program states may be p, where $p=2^a-1$.

Referring to FIG. 7, memory cells may have a threshold voltage belonging to a threshold voltage distribution corresponding to the erase state E or any one of the program states PV1 to PV7. For example, before a program operation is performed, the memory cells may be in the erase state E. In an embodiment, the first program state PV1 may be a state of the memory cells after an erase operation is performed.

A program voltage Vpgm may increase by a predetermined step program voltage ΔV whenever a program loop is repeated. The threshold voltage of the memory cells may increase according to the program voltage Vpgm, and the threshold voltage distribution of the memory cells may be changed whenever the program operation is performed. For example, the threshold voltage distribution of the memory cells after the erase operation is performed may be changed (or moved) in a direction in which the threshold voltage increases.

Whenever the program operation is performed (or whenever the program loop is repeated), verify steps on the respective first to seventh program states PV1 to PV7 may be sequentially performed from the first program state PV1 to the seventh program state PV7.

Verification on the first program state PV1 may include an operation of determining whether threshold voltages of selected memory cells have reached a threshold voltage corresponding to the first program state PV1, e.g., a first verify voltage Vvfy1. Memory cells having a threshold voltage higher than the first verify voltage Vvfy1 among memory cells to be programmed to the first program state PV1 may be in an off-state (or be off-cells). Memory cells having a threshold voltage lower than or equal to the first verify voltage Vvfy1 among the memory cells to be programmed to the first program state PV1 may be in an on-state (or be on-cells).

Verification on each of the second to seventh program states PV2 to PV7 may include an operation of determining whether the threshold voltages of the selected memory cells have reached a threshold voltage corresponding to each of the second to seventh program states PV2 to PV7, e.g., each of second to seventh verify voltages Vvfy2 to Vvfy7.

Figure 8:
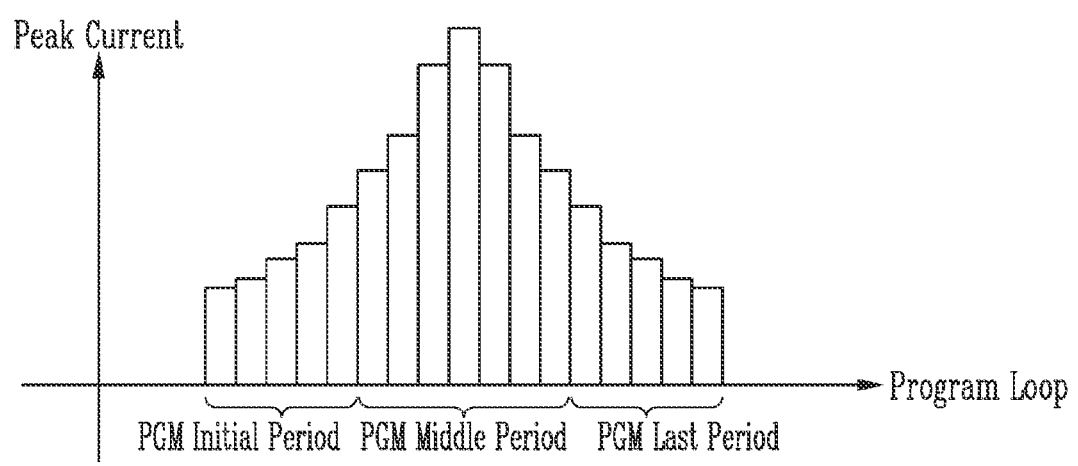
FIG. 8 illustrates an embodiment of peak current flowing through a bit line.

FIG. 8 is a graph illustrating an example of a peak current flowing through a bit line according to a performance degree of a program operation.

Referring to FIGS. 3 and 8, as described above with reference to FIG. 3, when a bit line voltage is applied to the plurality of bit lines BL1 to BLn in a program operation, a parasitic capacitor may be generated between the plurality of bit lines BL1 to BLn. A peak current Peak Current may be generated in each of plurality of bit lines BL1 to BLn by the parasitic capacitor.

The magnitude of the peak current Peak Current may be changed according to a performance degree of the program operation. The performance degree of the program operation may be divided into, for example, a program initial period PGM Initial Period, a program middle period PGM Middle Period, and a program last period PGM Last Period. The program operation may be divided into different (or different numbers of) periods in another embodiment. For example, the performance degree of the program operation may be divided into more detailed periods than the program initial period PGM Initial Period, the program middle period PGM Middle Period, and the program last period PGM Last Period.

For example, the magnitude of the peak current Peak Current may increase from the program initial period PGM Initial Period to the program middle period PGM Middle Period. The magnitude of the peak current Peak Current may decrease from the program middle period PGM Middle Period to the program last period PGM Last Period.

In an embodiment, the performance degree of the program operation may be a degree to which a loop count of a program loop is repeated. For example, the program initial period PGM Initial Period may be a period corresponding to when the loop count of the program loop is less than a first reference count, the program middle period PGM Middle Period may be a period corresponding to when the loop count of the program loop is greater than or equal to the first reference count and is less than a second reference count, and the program last period PGM Last Period may be a period corresponding to when the loop count of the program loop is greater than or equal to the second reference count. The second reference count may be greater than the first reference count.

The reason the magnitude of the peak current Peak Current is changed according to the performance degree of the program operation is because a number of bit lines to which a program allow voltage is applied (among the plurality of bit lines BL1 to BLn) is different from that of bit lines to which a program inhibit voltage is applied among the plurality of bit lines BL1 to BLn.

For example, when assuming that selected memory cells are TLCs, the number of target states is 8, e.g., an erase state E and first to seventh program states PV1 to PV7. In the program initial period PGM Initial Period, the probability that the program allow voltage will be applied to the plurality of bit lines BL1 to BLn may be higher than the probability that the program inhibit voltage will be applied to the plurality of bit lines BL1 to BLn. For example, when the program operation is started, the selected memory cells may be programmed with a probability of 7/8. Therefore, the program allow voltage may be applied to the plurality of bit lines BL1 to BLn with a probability of 7/8, and the program inhibit voltage be applied to the plurality of bit lines BL1 to BLn with a probability of 1/8.

The number of bit lines to which the program allow voltage is applied among the plurality of bit lines BL1 to BLn may be relatively large (e.g., above a predetermined value). The voltage difference between the plurality of bit lines BL1 to BLn may be a difference between program allow voltages applied between a majority (e.g., predetermined number) of the plurality of bit lines BL1 to BLn, and the difference between the program allow voltages may come close to a predetermined number, e.g., 0. Therefore, the parasitic capacitor generated between the plurality of bit lines BL1 to BLn may be eliminated or be very low (e.g., to within a predetermined tolerance), and the magnitude of the peak current Peak Current may be relatively low (e.g., below a predetermined level).

In the program middle period PGM Middle Period, a larger number of memory cells programmed to a target state (among the selected memory cells) may exist than that of memory cells in the program initial period PGM Initial Period. Since the program inhibit voltage is applied to a bit line connected to the programmed memory cells, the difference between the probability that the program allow voltage will be applied to the plurality of bit lines BL1 to BLn and the probability that the program inhibit voltage will be applied to the plurality of bit lines BL1 to BLn may be decreased in accordance with one or more steps. The number of bit lines to which the program allow voltage is applied among the plurality of bit lines BL1 to BLn may be almost equal to that (e.g., within a predetermined tolerance) of bit lines to which the program inhibit voltage is applied among the plurality of bit lines BL1 to BLn. Therefore, the parasitic capacitor may be generated based on differences between program allow voltages and program inhibit voltages, which are applied between the plurality of bit lines BL1 to BLn, and the magnitude of the peak current Peak Current may be relatively high (e.g., above a predetermined magnitude).

In the program last period PGM Last Period, a larger number of memory cells programmed to a target state (among the selected memory cells) may exist than that of memory cells in the program middle period PGM Middle Period. The probability that the program allow voltage will be applied to the plurality of bit lines BL1 to BLn may be lower than the probability that the program inhibit voltage will be applied to the plurality of bit lines BL1 to BLn. The number of bit lines to which the program allow voltage is applied (among the plurality of bit lines BL1 to BLn) may be less than that of bit lines to which the program inhibit voltage is applied among the plurality of bit lines BL1 to BLn. The voltage difference between the plurality of bit lines BL1 to BLn may be a difference between program inhibit voltages applied between a majority (e.g., predetermined number) of the plurality of bit lines BL1 to BLn, and the difference between the program inhibit voltages may come close to a predetermined value (e.g., 0) to within a given tolerance. Therefore, the parasitic capacitor between the plurality of bit lines BL1 to BLn may be limited to reduce to within a predetermined tolerance, and the magnitude of the peak current Peak Current may be relatively high (e.g., above a predetermined magnitude).

In one embodiment, the peak current Peak Current may be a current which disturbs the selected memory cells from being programmed to the target voltage. Also, since the peak current Peak Current flowing through a bit line is a current in which an introduced charge amount rapidly increases (e.g., a rate above predetermined rate) as compared with time, the peak current Peak Current may be a current that damages the bit line.

When the peak current Peak Current is decreased, the time for the bit line to be precharged increases, and hence performance of the storage device may be degraded when the time for which the program operation is completed increases. Embodiments of a page buffer controller for decreasing the peak current, while preventing or reducing an increase in time for which the program operation is completed, are described below.

Figure 9:
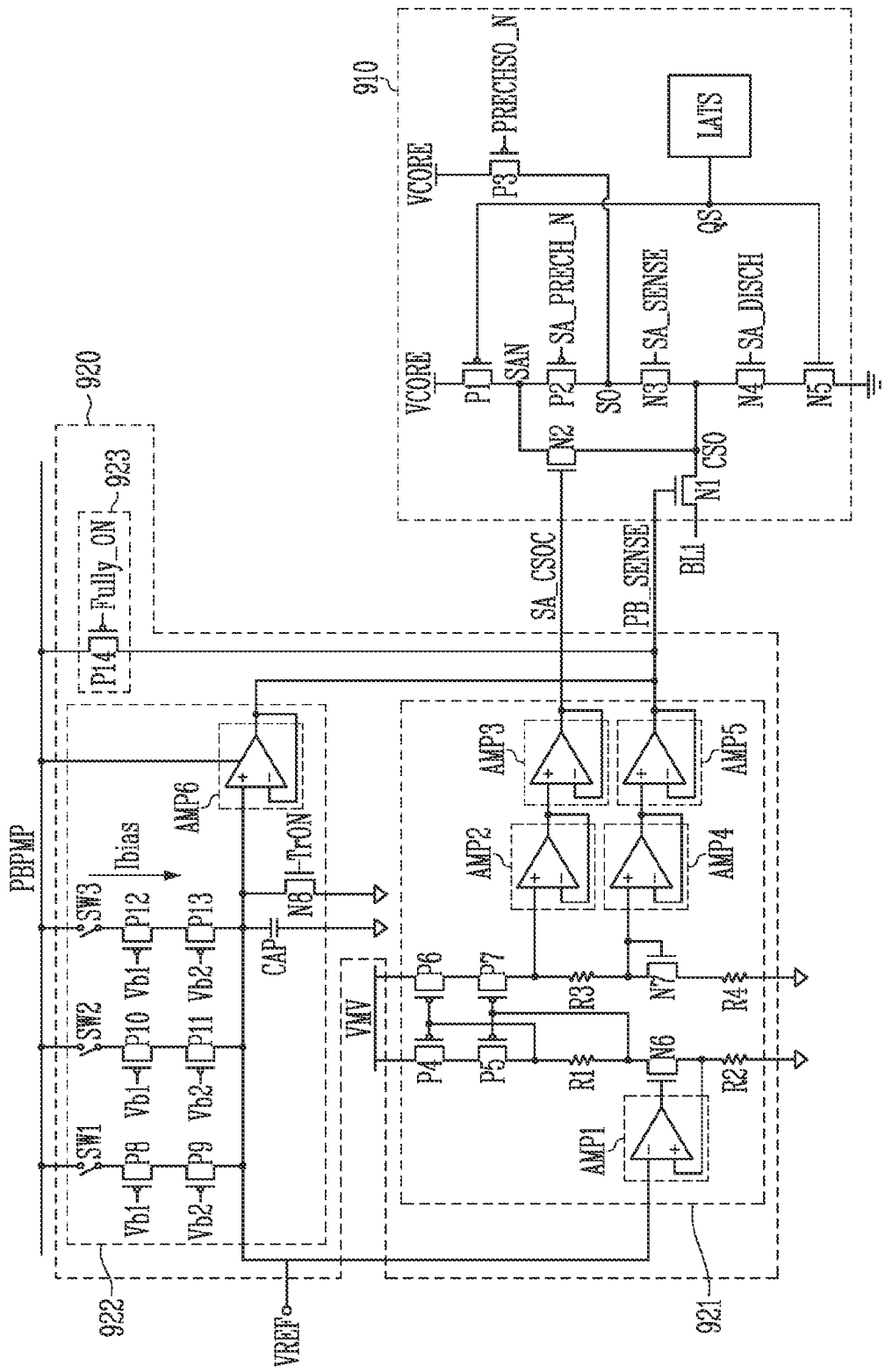
FIG. 9 illustrates an embodiment of a page buffer and page buffer controller.

FIG. 9 is a circuit diagram illustrating a page buffer controller and a page buffer in accordance with an embodiment. The page buffer 910 shown in FIG. 9 may be, for example, the page buffer 102 shown in FIG. 1. In one embodiment, the page buffer 910 shown in FIG. 9 may be one page buffer among the first to nth page buffers PB1 to PBn shown in FIG. 2. For convenience of description, it is assumed that the page buffer 910 shown in FIG. 9 is the first page buffer PB1 shown in FIG. 2, but the embodiment described with reference to FIG. 9 may be applied to the second to nth page buffers PB2 to PBn.

Referring to FIGS. 2, 5, and 9, the page buffer 910 may operate in response to a page buffer control signal PBSIGNALS from the control logic 130. The page buffer control signal PBSIGNALS may include, for example, a page buffer sensing signal PB_SENSE, a current sensing signal SA_CSOC, a sense amp precharge signal SA_PRECH_N, a sensing node precharge signal PRECHSO_N, a sense amp sensing signal SA_SENSE, and a sense amp discharge signal SA_DISCH. In an embodiment, the page buffer sensing signal PB_SENSE and the current sensing signal SA_CSOC may be signals provided by page buffer controller 920.

In an embodiment, the page buffer 910 may provide a bit line voltage to a first bit line BL1 in response to the page buffer sensing signal PB_SENSE. The bit line voltage may be a ground voltage corresponding to the program allow voltage or a power voltage VCORE corresponding to the program inhibit voltage.

The page buffer 910 may be connected to a memory cell through the first bit line BL1, and perform a bit line precharge operation of charging charges supplied from the power voltage VCORE in the first bit line BL through first to fifth NMOS transistors N1 to N1 and first to third PMOS transistors P1 to P3. Also, the page buffer 910 may discharge, to the ground voltage, charges charged in the first bit line BL1 through the first NMOS transistor N1, the fourth NMOS transistor N4, and the fifth NMOS transistor N5.

The first NMOS transistor N1 may be connected between the first bit line BL1 and a common node CSO. The first NMOS transistor N1 may be controlled by the page buffer sensing signal PB_SENSE. The page buffer sensing signal PB_SENSE may be applied to a gate electrode of the first NMOS transistor N1. The first NMOS transistor N1 may be a page buffer sensing transistor.

The second NMOS transistor N2 may be connected between the common node CSO and a sense amp node SAN. The second NMOS transistor N2 may be controlled by the current sensing signal SA_CSOC. The current sensing signal SA_CSOC may be applied to a gate electrode of the second NMOS transistor N2.

The third NMOS transistor N3 may be connected between a sensing node SO and the common node CSO. The third NMOS transistor N3 may be connected by the sense amp sensing signal SA_SENSE. The sense amp sensing signal SA_SENSE may be applied to a gate electrode of the third NMOS transistor N3.

The fourth NMOS transistor N4 may be controlled by the sense amp discharge signal SA_DISCH. The sense amp discharge signal SA_DISCH may be applied to a gate electrode of the fourth NMOS transistor N4.

The fifth NMOS transistor N5 may be controlled by a node QS voltage of a sensing latch circuit LATS. The node QS voltage of the sensing latch circuit LATS may be applied to a gate electrode of the fifth NMOS transistor N5. The fourth and fifth NMOS transistors N4 and N5 may be connected in series between the common node CSO and the ground voltage.

The first PMOS transistor P1 may be connected between the power voltage VCORE and the sense amp node SAN. The first PMOS transistor P1 may be controlled by the node QS voltage of the sensing latch circuit LATS. The node QS voltage of the sensing latch circuit LATS may be applied to a gate electrode of the first PMOS transistor P1.

The second PMOS transistor P2 may be connected between the sense amp node SAN and the sensing node SO. The second PMOS transistor P2 may be controlled by the sense amp precharge signal SA_PRECH_N. The sense amp precharge signal SA_PRECH_N may be applied to a gate electrode of the second PMOS transistor P2.

The third PMOS transistor P3 may be connected between the power voltage VCORE and the sensing node SO. The third PMOS transistor P3 may be controlled by the sensing node precharge signal PRECHSO_N. The sensing node precharge signal PRECHSO_N may be applied to a gate electrode of the third PMOS transistor P3.

The sensing latch circuit LATS may include a latch configured with two inverters (connected to a node QS) and a reset transistor and a set transistor which control a voltage of the node QS.

The page buffer controller 920 shown in FIG. 9 may be, for example, the page buffer controller 101 shown in FIGS. 1 and 2. In accordance with one embodiment, the page buffer controller 920 may include a first signal provider 921, a second signal provider 922, and a third signal provider 923.

The first signal provider 921 may provide a pulse signal as the page buffer sensing signal PB_SENSE. This pulse signal may be generated by the voltage generator 121 during a first period in a precharge period and may serve as a reference voltage VREF. The voltage level of the reference voltage VREF may be greater than that the ground voltage (e.g., 0V). In one embodiment, the reference voltage VREF may correspond to or be based on a sum of the bit line voltage and a threshold voltage of the first NMOS transistor N1. However, the reference voltage VREF may have a different value in another embodiment.

In an embodiment, the first signal provider 921 may include first to fifth voltage output circuits AMP1 to AMP5 and a current mirror circuit. The first voltage output circuit AMP1 may output the reference voltage VREF generated by the voltage generator 121 to the current mirror circuit. The reference voltage VREF may be applied to a first input terminal (e.g., an inverting terminal) of the first voltage output circuit AMP1. A second input terminal (e.g., a non-inverting terminal) of the first voltage output circuit AMP1 may be connected to the current mirror circuit. The first voltage output circuit AMP1 may be, for example, a buffer amplifier.

The current mirror circuit may generate the current sensing signal SA_CSOC based on the reference voltage VREF and a mirror voltage VMV, and may provide the current sensing signal SA_CSOC to the second voltage output circuit AMP2. Also, the current mirror circuit may generate the page buffer sensing signal PB_SENSE based on the reference voltage VREF and the mirror voltage VMV, and may provide the page buffer sensing signal PB_SENSE to the fourth voltage output circuit AMP4.

In an embodiment, the current mirror circuit may include fourth to seventh PMOS transistors P4 to P7, sixth and seventh NMOS transistors N6 and N7, and first to fourth resistors R1 to R4. The fourth and fifth PMOS transistors P4 and P5 may be connected in series between the mirror voltage VMV and the first resistor R1. A gate electrode of the fourth PMOS transistor P4 may be connected to one end of the first resistor R1. A gate electrode of the fifth PMOS transistor P5 may be connected to the other end of the first resistor R1. The first resistor R1 may be connected between the fifth PMOS transistor P5 and the sixth NMOS transistor N6.

The sixth NMOS transistor N6 may be connected between the first resistor R1 and the second resistor R2. An output terminal of the first voltage output circuit AMP1 may be connected to a gate electrode of the sixth NMOS transistor N6. One electrode of the sixth NMOS transistor N6 may be connected to one end of the second resistor R2 and the second input terminal of the first voltage output circuit AMP1. The second resistor R2 may be connected between the sixth NMOS transistor N6 and the ground voltage.

The sixth and seventh PMOS transistors P6 and P7 may be connected in series between the mirror voltage VMV and the third resistor R3. A gate electrode of the sixth PMOS transistor P6 may be connected to the one end of the first resistor R1. A gate electrode of the seventh PMOS transistor P7 may be connected to the other end of the first resistor R1. The third resistor R3 may be connected between the seventh PMOS transistor P7 and the seventh NMOS transistor N7.

The current sensing signal SA_CSOC may be generated at a node to which one electrode of the seventh PMOS transistor P7 and one end of the third resistor R3 are connected.

The seventh NMOS transistor N7 may be connected between the third resistor R3 and the fourth resistor R4. A gate electrode of the seventh NMOS transistor N7 may be connected to the other end of third resistor R3.

The page buffer sensing signal PB_SENSE may be generated at a node to which one electrode of seventh NMOS transistor N7 and the other end of the third resistor R3 are connected. The fourth resistor R4 may be connected between the seventh NMOS transistor N7 and the ground voltage. Each of the second to fifth voltage output circuits AMP2 and AMP5 may be, for example, a buffer amplifier.

The second voltage output circuit AMP2 may output the current sensing signal SA_CSOC generated by the current mirror circuit.

The third voltage output circuit AMP3 may output the current sensing signal SA_CSOC output by the second voltage output circuit AMP2 to the gate electrode of the second NMOS transistor N2 page buffer 910.

In the embodiment shown in FIG. 9, the first signal provider 921 may include, for example, the second voltage output circuit AMP2 and the third voltage output circuit AMP3, but the present disclosure is not limited thereto. For example, the second voltage output circuit AMP2 and the third voltage output circuit AMP3, which are shown in FIG. 9, may be implemented as one buffer amplifier. In this case, the first signal provider 921 may include only one of the second voltage output circuit AMP2 and the third voltage output circuit AMP3. In another example, the first signal provider 921 may include three or more buffer amplifiers which output the current sensing signal SA_CSOC.

The fourth voltage output circuit AMP4 may output the page buffer sensing signal PB_SENSE generated by the current mirror circuit.

The fifth voltage output circuit AMP5 may output the page buffer sensing signal PB_SENSE output by the fourth voltage output circuit AMP4 to the gate electrode of the first NMOS transistor N1 included in the page buffer 910.

In the embodiment shown in FIG. 9, the first signal provider 921 may include the fourth voltage output circuit AMP4 and the fifth voltage output circuit AMP5, but the present disclosure is not limited thereto. For example, the fourth voltage output circuit AMP4 and the fifth voltage output circuit AMP5, which are shown in FIG. 9, may be implemented as one buffer amplifier. For example, the first signal provider 921 may include only one of the fourth voltage output circuit AMP4 and the fifth voltage output circuit AMP5. In another example, the first signal provider 921 may include three or more buffer amplifiers which output the page buffer sensing signal PB_SENSE.

The second signal provider 922 may output the page buffer sensing signal PB_SENSE increased based on an increment determined according to a performance degree of the program operation after the first period. For example, the second signal provider 922 may provide a ramp signal as the page buffer sensing signal PB_SENSE, where the ramp signal increases from a first voltage level to a second voltage level. The slope of the ramp signal may be determined, for example, according to a loop count of a plurality of program loops (among a plurality of predetermined slopes) after the first period.

In one example, the second signal provider 922 may provide a step signal as the page buffer sensing signal PB_SENSE, where the step signal increases from the first voltage level to the second voltage level based on one or more steps. The step signal may increase, for example, according to a step voltage determined based on a loop count of a plurality of program loops among a plurality of predetermined step voltages.

The first voltage level may be the voltage level of the reference voltage VREF. The voltage level of the reference voltage VREF may be greater than that of the ground voltage (e.g., 0V). For example, the reference voltage VREF may correspond to or be based on a sum of the bit line voltage and the threshold voltage of the first NMOS transistor N1. The reference voltage VREF may have a different value in another embodiment.

In an embodiment, the second signal provider 922 may include a plurality of switches SW1 to SW3, eighth to thirteenth PMOS transistors P8 to P13, a capacitor CAP, an eighth NMOS transistor M8, and a sixth voltage output circuit AMP6.

The plurality of switches SW1 to SW3 may be provided with a page buffer pump voltage PBPMP. The page buffer pump voltage PBPMP may be generated by the voltage generator 121. The plurality of switches SW1 to SW3 may be connected between the page buffer pump voltage PBPMP and the eighth to thirteenth PMOS transistors P8 to P13. When the plurality of switches SW1 to SW3 are turned on, the page buffer pump voltage PBPMP may be provided to the eighth to thirteenth PMOS transistors P8 to P13.

In an embodiment, the magnitude of a bias current Ibias may be changed according to a number of switches turned on, among the plurality of switches SW1 to SW3. For example, the magnitude of the bias current Ibias may be changed, and the slope of the ramp signal may be changed according to a number of switches turned on among the plurality of switches SW1 to SW3. For example, the slope of the ramp signal may increase as the number of switches turned on among the plurality of switches SW1 to SW3 becomes larger.

The number of the plurality of switches SW1 to SW3 may be 3 as shown in FIG. 9, but may be a different number in another embodiment, e.g., the number of the plurality of switches SW1 to SW3 may be less than or greater than 3. The slope of the ramp signal or the step voltage of the step signal may be more finely adjusted.

The eighth to thirteenth PMOS transistors P8 to P13 may be connected between the plurality of switches SW1 to SW3 and the reference voltage VREF. The eighth to thirteenth PMOS transistors P8 to P13 may be grouped and connected to the plurality of switches SW1 to SW3. Each of the eighth to thirteenth PMOS transistors P8 to P13 may be controlled by voltage control signals Vb1 and Vb2. The voltage control signals Vb1 and Vb2 may be provided by the control logic 130, which provide the voltage control signals Vb1 and Vb2 according to a loop count of the program loop.

When each of the eighth to thirteenth PMOS transistors P8 to P13 is turned on, the bias current Ibias may flow in a direction toward the reference voltage VREF from the page buffer pump voltage PBPMP. In an embodiment, the eighth to thirteenth PMOS transistors P8 to P13 may more finely adjust the bias current Ibias.

The capacitor CAP may be connected between the reference voltage VREF and the ground voltage. The capacitor CAP may charge a capacitor voltage according to the bias current Ibias.

The eighth transistor N8 may be connected between the reference voltage VREF and the ground voltage. The eighth transistor N8 may be controlled by a transistor turn-on voltage TrON.

The sixth voltage output circuit AMP6 may receive the capacitor voltage charged by the capacitor CAP, and provide the capacitor voltage as the page buffer sensing signal PB_SENSE. The sixth voltage output circuit AMP6 may be, for example, a buffer amplifier.

The third signal provider 923 may provide, as the page buffer sensing signal PB_SENSE, a pulse signal having a voltage level of the turn-on voltage Vpbs. In an embodiment, the third signal provider 923 may include a fourteenth PMOS transistor P14. The fourteenth transistor P14 may be controlled by a high-voltage control signal Fully_ON. The high-voltage control signal Fully_ON may be provided by the control logic 130. The fourteenth PMOS transistor P14 may be turned on by the high-voltage control signal Fully_ON to provide the page buffer pump voltage PBPMP as the page buffer sensing signal PB_SENSE.

The page buffer 910 and the page buffer controller 920 may be implemented, for example, as a circuit as shown in FIG. 9, but may be implemented in a different manner in another embodiment. The page buffer 910 and the page buffer controller 920 may be implemented in various ways, for example, according to a design method.

Figure 10:
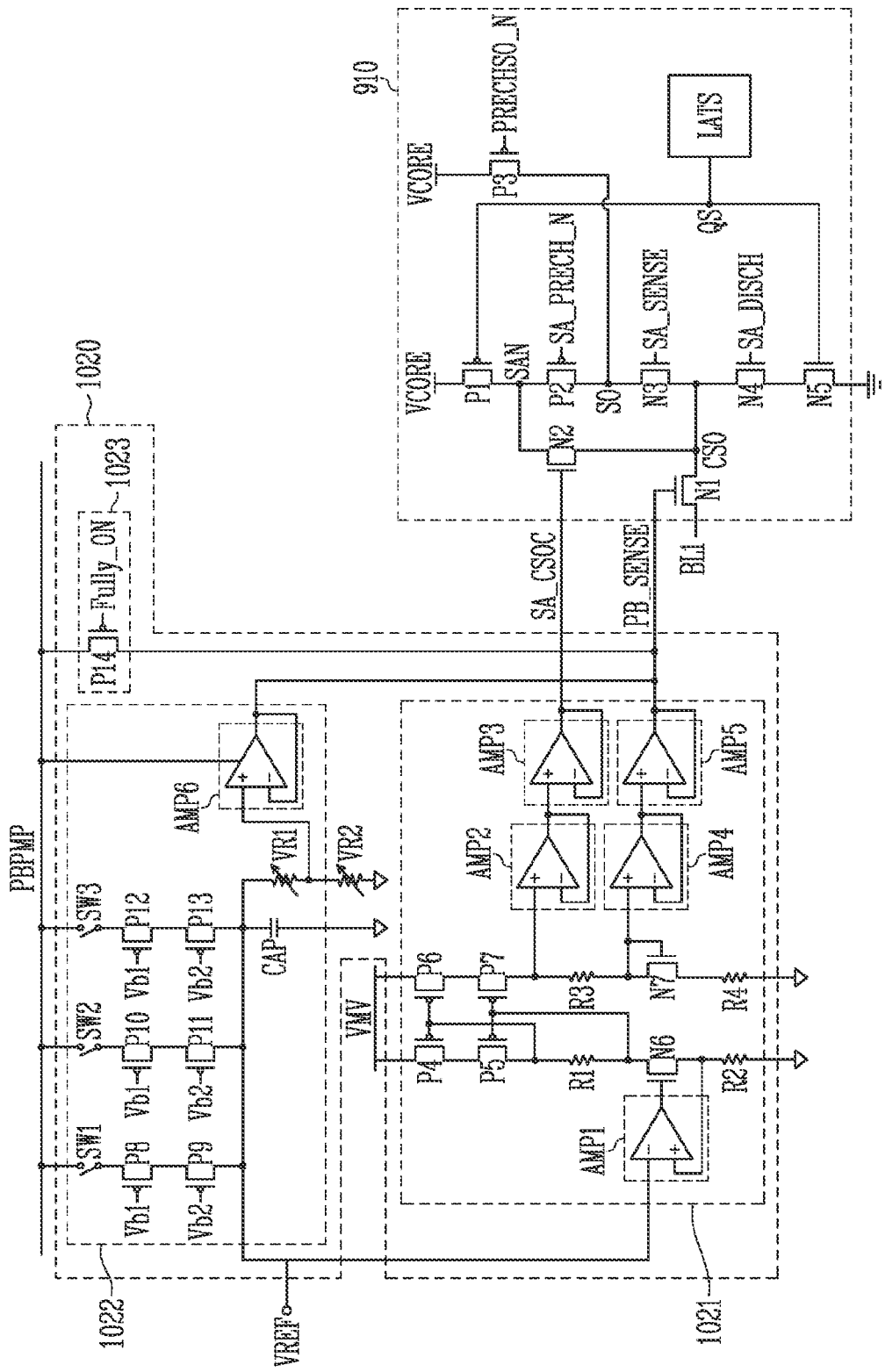
FIG. 10 illustrates an embodiment of a page buffer and page buffer controller.

FIG. 10 is a circuit diagram illustrating a page buffer controller and a page buffer in accordance with an embodiment. In FIG. 10, the page buffer 910 shown in FIG. 10 may be the same as described above. Also, page buffer controller 1020 shown in FIG. 10 may perform the same function as the page buffer controller 920 shown in FIG. 9.

Referring to FIG. 10, the page buffer controller 1020 may include a first signal provider 1021, a second signal provider 1022, and a third signal provider 1023. The first signal provider 1021 is identical to the first signal provider 921 shown in FIG. 9. The second signal provider 1022, like the second signal provider 922 shown in FIG. 9, may include a plurality of switches SW1 to SW3, eighth to thirteenth PMOS transistors P8 to P13, a capacitor CAP, and a sixth voltage output circuit AMP6.

The second signal provider 1022 may include a first variable resistor VR1 and a second variable resistor VR2, instead of the eighth NMOS transistor N8 included in the second signal provider 922 shown in FIG. 9.

The first variable resistor VR1 and the second variable resistor VR2 may be connected in series to each other. One end of the first variable resistor VR1 may be commonly connected to the ninth, eleventh, and thirteenth PMOS transistors P9, P11, and P13. The other end of the first variable resistor VR1 may be connected to one end of the second variable resistor VR2.

The one end of the second variable resistor VR2 may be connected to the other end of the first variable resistor VR1. A voltage generated at a node to which the one end of the second variable resistor VR2 and the other end of the first variable resistor VR1 are connected may be provided to the sixth voltage output circuit AMP6.

The third signal provider 1023 may correspond to the third signal provider 923 shown in FIG. 9.

The page buffer controller 1020 may be implemented as a circuit as shown in FIG. 10, or may be implemented in a different manner in another embodiment. The page buffer controller 1020 may be implemented in various ways, for example, according to a design method.

Figure 11:
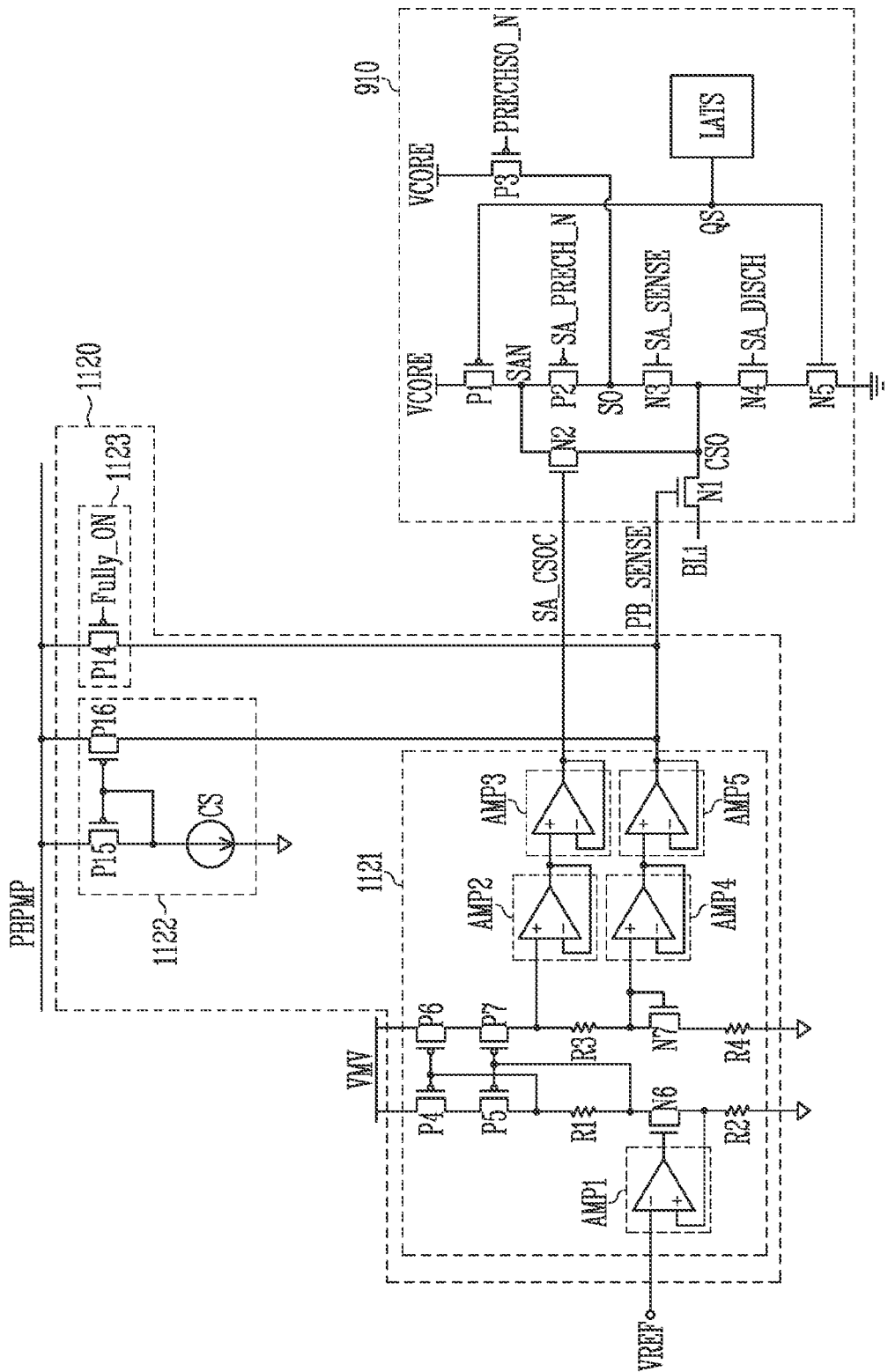
FIG. 11 illustrates an embodiment of a page buffer and page buffer controller.

FIG. 11 is a circuit diagram illustrating a page buffer controller and a page buffer in accordance with an embodiment. Referring to FIG. 11, the page buffer 910 shown in FIG. 11 may be the same as described above. The page buffer controller 1120 shown in FIG. 11 may perform the same function as the page buffer controller 920 shown in FIG. 9 or the page buffer controller 1020 shown in FIG. 10.

The page buffer controller 1120 may include a first signal provider 1121, a second signal provider 1122, and a third signal provider 1123. The first signal provider 1121 is identical to the first signal provider 921 shown in FIG. 9 or the first signal provider 1021 shown in FIG. 10.

The second signal provider 1122 may include fifteenth and sixteenth PMOS transistors P15 and P16 and a current source CS. The fifteenth PMOS transistor P15 may be connected between the page buffer pump voltage PBPMP and the current source CS. A gate electrode of the fifteenth PMOS transistor P15 may be connected to a first electrode of the fifteenth PMOS transistor P15 and the current source CS. The current source CS may provide a current flowing in a direction toward the ground voltage from the page buffer pump voltage PBPMP.

The sixteenth PMOS transistor P16 may be connected between the page buffer pump voltage PBPMP and the first NMOS transistor N1. A gate electrode of the sixteenth PMOS transistor P16 may be connected to the current source CS. The sixteenth PMOS transistor P16 may provide the current generated by the current source CS to the gate electrode of the first NMOS transistor N1.

The third signal provider 1123 may be identical to the third signal provider 923 shown in FIG. 9 or the third signal provider 1023 shown in FIG. 10.

The page buffer controller 1120 may be implemented as a circuit as shown in FIG. 11, but may be implemented in a different manner in another embodiment. The page buffer controller 1120 may be implemented in various ways, for example, according to a design method.

Figure 12:
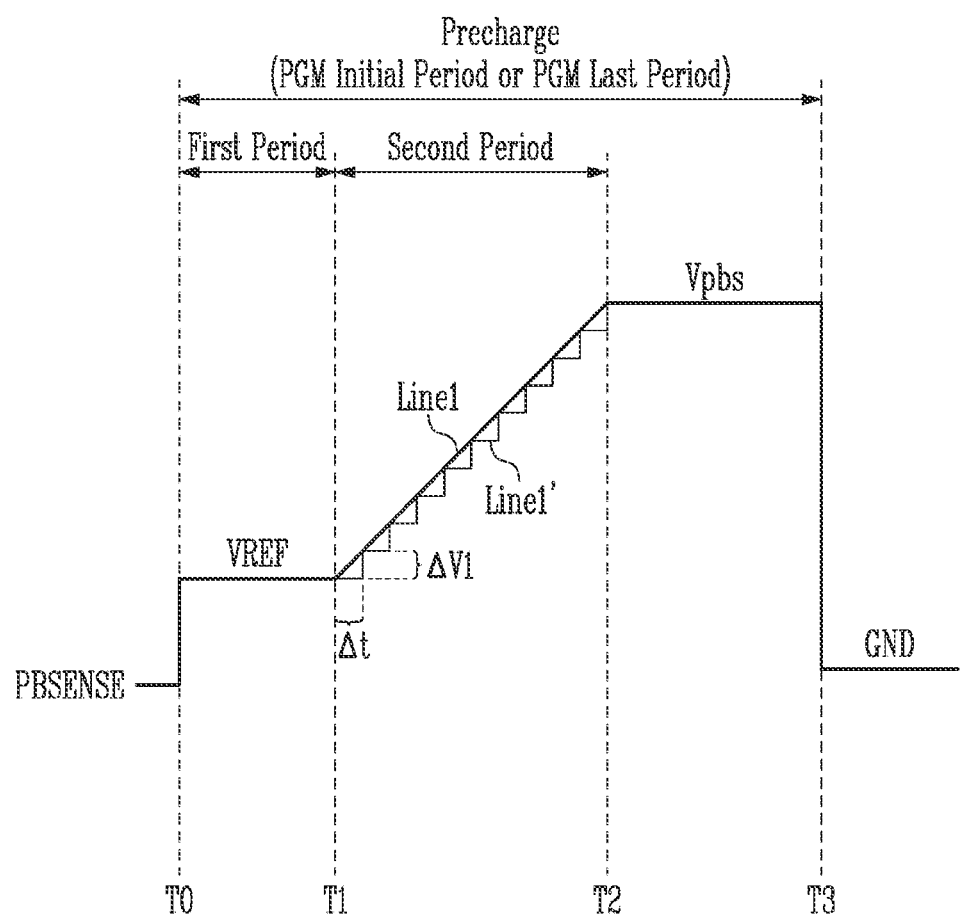
FIG. 12 illustrates an embodiment of a page buffer sensing signal.

FIG. 12 is a diagram illustrating embodiments of a page buffer sensing signal provided in a program initial period or a program last period.

Referring to FIG. 12, a precharge period Precharge shown in FIG. 12 may be a period in which a precharge operation is performed in a program initial period PGM Initial Period or a program last period PGM Last Period. In an embodiment, the program initial period PGM Initial Period may be a period corresponding to a case where a loop count of a current program operation is equal to or less than a first reference count. The program last period PGM Last Period may be a period corresponding to a case where the loop count of the current program operation is greater than a second reference count. The second reference count may be greater than the first reference count.

During a first period First Period, a pulse signal having the voltage level of the reference voltage VREF may be provided as the page buffer sensing signal PB_SENSE to a gate electrode of a page buffer sensing transistor (e.g., the first NMOS transistor N1 shown in FIGS. 9 to 11).

The first period First Period may be a period from a time T0 to a time T1. The pulse signal having the voltage level of the reference voltage VREF may be generated by, for example, the first signal provider 921. The voltage level of the reference voltage VREF may be greater than that (e.g., 0V) of the ground voltage. For example, the reference voltage VREF may be a sum of the bit line voltage and the threshold voltage of the first NMOS transistor N1. The reference voltage VREF may have a different value in another embodiment.

During a second period Second Period after the first period First Period, in one embodiment a first ramp signal Line1 may be provided as the page buffer sensing signal PB_SENSE to the gate electrode of the page buffer sensing transistor. The first ramp signal Line1 may increase with a first slope, which, for example, may be based on a first step voltage ΔV1 with respect to a unit time Δt.

In one embodiment, during the second period Second Period after the first period First Period, a first step signal Line1' may be provided as the page buffer sensing signal PB_SENSE to the gate electrode of the page buffer sensing transistor. The first step signal Line1' may be a signal that increases in one or more steps based on the first step voltage ΔV1 for every unit time Δt.

During the second period Second Period, the page buffer sensing signal PB_SENSE may increase from a first voltage level to a second voltage level. The first voltage level may be the voltage level of the reference voltage VREF. The second voltage level may be the voltage level of the turn-on voltage Vpbs. The turn-on voltage Vpbs may be a voltage at which the page buffer sensing transistor is turned on.

The second period Second Period may be a period from time T1 to time T2. The first ramp signal Line1 or the first step signal Line1' may be sensed by, for example, the second signal provider 922.

After the second period Second Period, a pulse signal having the second voltage level may be provided as the page buffer sensing signal PB_SENSE to the gate electrode of the page buffer sensing transistor. The period in which the pulse signal having the second voltage level is provided may be a period from time T2 to time T3. The pulse signal having the second voltage level may be generated by, for example, the second signal provider 922.

At time T3, the page buffer sensing signal PB_SENSE applied to the gate electrode of the page buffer sensing transistor may be discharged as the ground voltage.

In accordance with the foregoing embodiments, the peak current generated in each of the program initial period and the program last period is prevented from increasing, or if an increase occurs the degree to which the increase occurs is reduced. Also, the time for the program operation to be completed is prevented from increasing, or if an increase occurs the degree to which the increase occurs is reduced. As a result, performance of the program operation can be improved.

Figure 13:
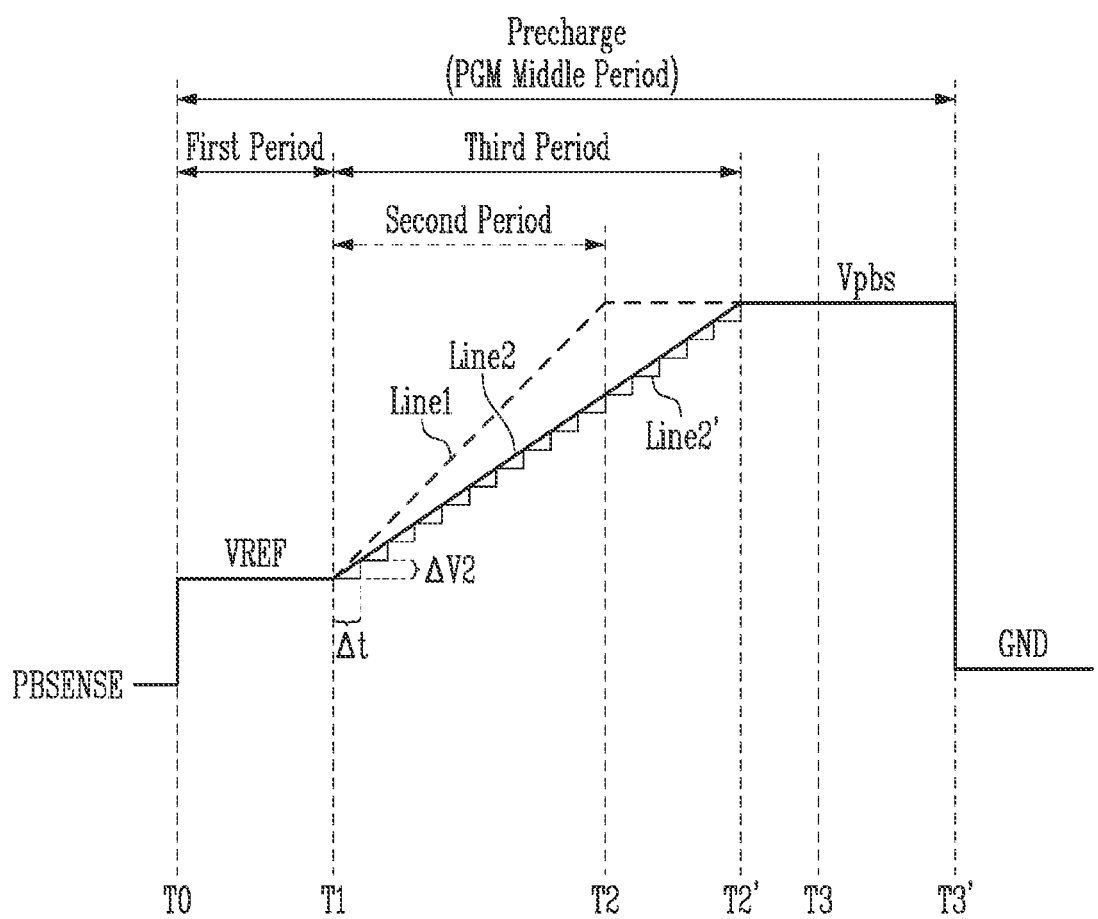
FIG. 13 illustrates an embodiment of a page buffer sensing signal.

FIG. 13 is a diagram illustrating embodiments of a page buffer sensing signal provided in a program middle period.

In FIG. 13, a precharge period Precharge may be a period in a precharge operation performed in a program middle period PGM Middle Period. In an embodiment, the program middle period PGM Middle Period may be a period corresponding to a case where a loop count of a current program operation is greater than the first reference count and is equal to or smaller than the second reference count.

Referring to FIG. 13, during a first period First Period from time T0 to time T1, a pulse signal having the voltage level of the reference voltage VREF may be provided to a gate electrode of a page buffer sensing transistor (e.g., the first NMOS transistor N1 shown in FIGS. 9 to 11).

In an embodiment, during a third period Third Period after the first period First Period, a second ramp signal Line2 may be provided as the page buffer sensing signal PB_SENSE to the gate electrode of the page buffer sensing transistor. The second ramp signal Line2 may be a signal increasing with a second slope. The second slope may correspond to a second step voltage ΔV2 with respect to a unit time Δt. The second slope may be less than the first slope.

In one embodiment, during the third period Third Period after the first period First Period, a second step signal Line2' may be provided as the page buffer sensing signal PB_SENSE to the gate electrode of the page buffer sensing transistor. The second step signal Line2' may be a signal which increases based on one or more steps based on the second step voltage ΔV2 for every unit time Δt.

During the third period Third Period, the page buffer sensing signal PB_SENSE may increase from a first voltage level to a second voltage level. The first voltage level may be the voltage level of the reference voltage VREF. The second voltage level may be the voltage level of the turn-on voltage Vbps. The third period Third Period may come after the first period First Period. In one embodiment, the third period Third Period may occur instead of a second period Second Period. In one embodiment, the third period Third Period may be longer than the second period Second Period. For example, when time T2 is a time prior to time T2', the third period Third Period may be a period from time T1 to time T2'. The second ramp signal or the second step signal Line2' may be generated by, for example, the second signal provider 922.

After the third period Third Period, a pulse signal having the second voltage level may be provided as the page buffer sensing signal PB_SENSE to the gate electrode of the page buffer sensing transistor. The period in which the pulse signal having the second voltage level is provided may be, for example, a period from the time T2' to a time T3'. The period from the time T2' to the time T3' may be equal to that from time T2 to time T3. The pulse signal having the second voltage level may be generated by, for example, the second signal provider 922.

At time T3', the page buffer sensing signal applied to the gate electrode of the page buffer sensing transistor may be discharged as the ground voltage.

As described above, an increase in peak current generated in the program middle period is prevented or such an increase may be reduced, and an excessive increase in time for which the program operation is completed is prevented or such an increase may be reduced. As a result, performance of the program operation can be improved.

Figure 14:
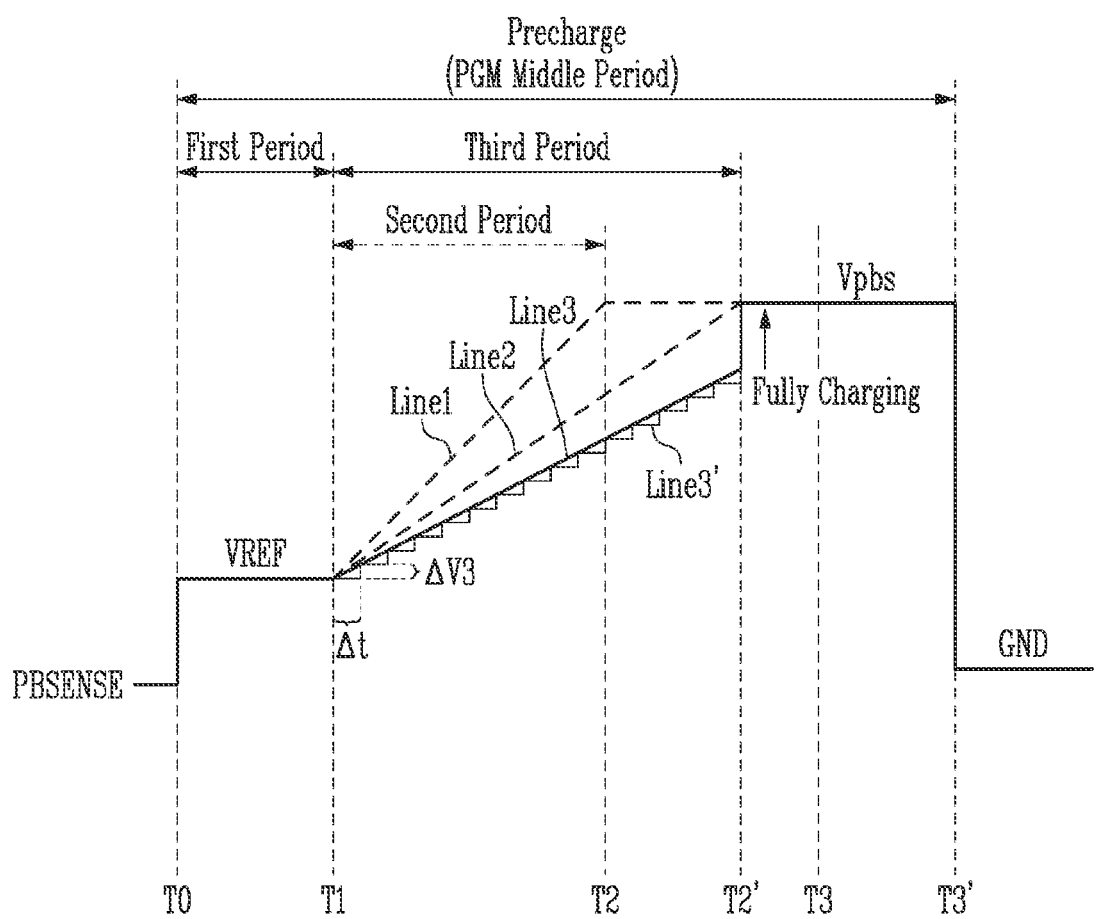
FIG. 14 illustrates an embodiment of a page buffer sensing signal provided in a program middle period.

FIG. 14 is a diagram illustrating an embodiment of the page buffer sensing signal provided in the program middle period. Like in FIG. 13, in FIG. 14, a precharge period Precharge may be a period in which a precharge operation is performed in the program middle period PGM Middle Period.

During a first period First Period from time T0 to time T1, a pulse signal having the voltage level of the reference voltage VREF may be provided to a gate electrode of a page buffer sensing transistor (e.g., the first NMOS transistor N1 shown in FIGS. 9 to 11).

During a third period Third Period after the first period First Period, in an embodiment a third ramp signal Line3 may be provided as the page buffer sensing signal PB_SENSE to the gate electrode of the page buffer sensing transistor. The third ramp signal Line3 may be a signal increasing with a third slope. The third slope may be a third step voltage ΔV3 with respect to a unit time Δt and may be less than the second slope.

In one embodiment, during the third period Third Period after the first period First Period, a third step signal Line3' may be provided as the page buffer sensing signal PB_SENSE to the gate electrode of the page buffer sensing transistor. The third step signal Line3' may be a signal that increases in one or more steps based on the third step voltage ΔV3 for every unit time Δt. The third ramp signal Line3 or the third step signal Line3' may be generated by, for example, the second signal provider 922.

During the third period Third Period, the page buffer sensing signal PB_SENSE may increase from a first voltage level to a second voltage level. The first voltage level may be the voltage level of the reference voltage VREF, and the second voltage level may be lower than that of the turn-on voltage Vpbs. When the second voltage level is lower than that of the turn-on voltage Vbps, the bit line voltage (e.g., power voltage VCORE) may not be sufficiently charged in the bit line.

After the third period Third Period, a pulse signal having the voltage level of the turn-on voltage Vbps may be provided as the page buffer sensing signal PB_SENSE to the gate electrode of the page buffer sensing transistor, in order to fully charge the bit line voltage (e.g., power voltage VCORE) in the bit line. The period in which the pulse signal having the voltage level of the turn-on voltage Vbps is provided may be, for example a period from time T2' to time T3', which, in one embodiment, may be equal to the period from time T2 to time T3. The pulse signal having the voltage level of the turn-on voltage Vbps may be generated by, for example, the third signal provider 923.

At time T3', the page buffer sensing signal PB_SENSE applied to the gate electrode of the page buffer sensing transistor may be discharged as the ground voltage.

As described above, an increase in peak current generated in the program middle period may be prevented or the increase may be reduced, and an excessive increase in time for which the program operation is completed may be prevented. In addition, it is ensured that the bit line voltage is sufficiently provided to the bit line. Thus, performance of the program operation can be improved.

Figure 15:
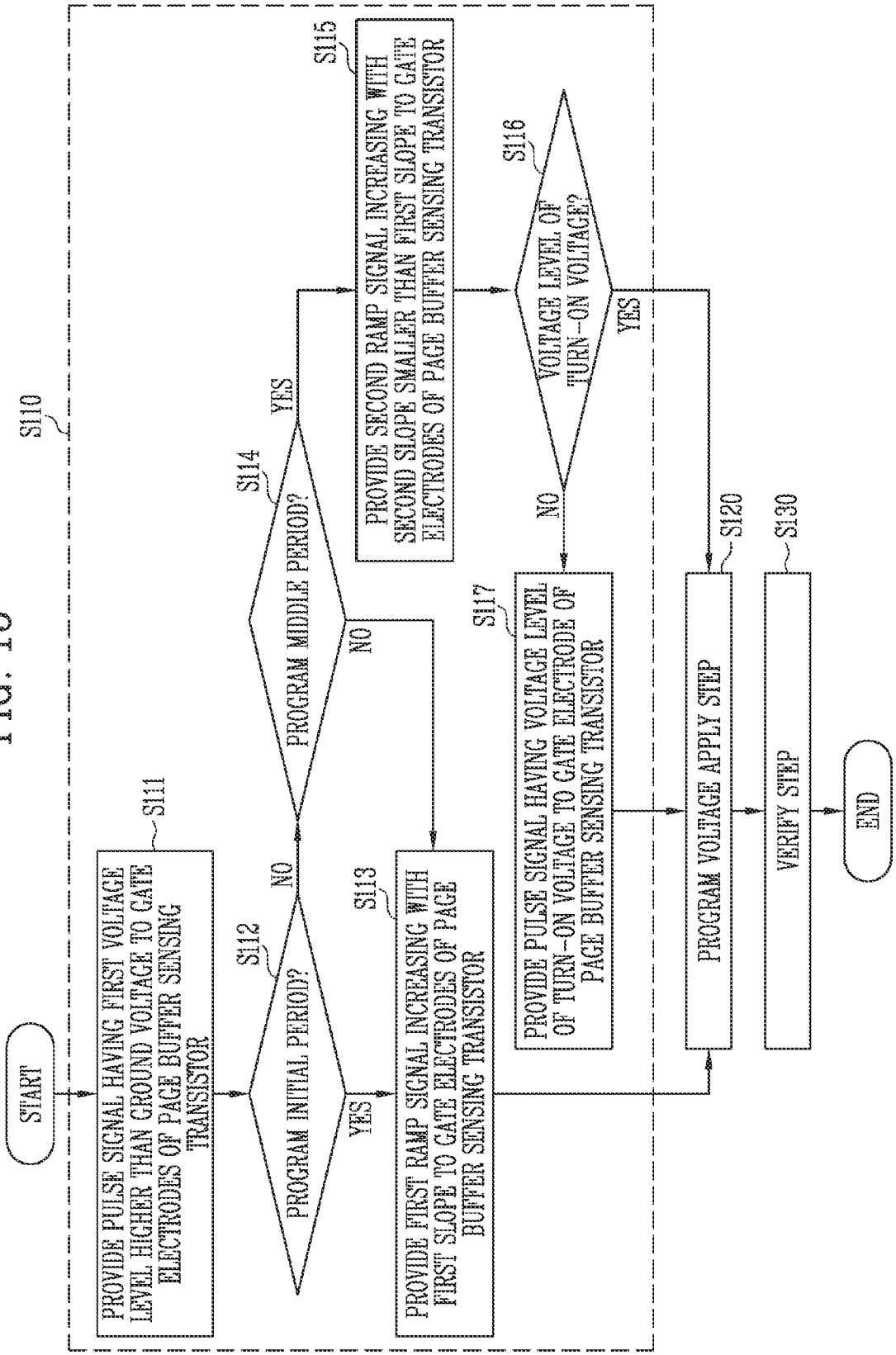
FIG. 15 illustrates an embodiment of a method of operating a memory device.

FIG. 15 is a diagram illustrating an embodiment of a method of operating a memory device, which, for example, may be any embodiments of the memory device described herein (e.g., memory device 100).

Referring to FIG. 15, the method may include a precharge operation S110, a program voltage apply operation S120, and a verify operation S130. The precharge operation S110 may include controlling the page buffer 102 to set a bit line voltage applied to a plurality of bit lines. An example of precharge operation S110 will be described in detail.

During a first period, the memory device 100 may provide the page buffer 102 with a pulse signal having a first voltage level higher than a ground voltage. For example, during the first period in the precharge operation, the page buffer controller 101 may provide the pulse signal as a page buffer sensing signal to a gate electrode of a page buffer sensing transistor (e.g., the first NMOS transistor N1) in the page buffer 102 (S111). The pulse signal may have the first voltage level higher than the ground voltage.

After the first period, the memory device 100 may provide the page buffer 102 with a ramp signal that increases from the first voltage level to a second voltage level. The slope of the ramp signal may be determined according to a loop count of a plurality of program loops, among a plurality of predetermined slopes.

For example, the page buffer controller 101 may check whether the performance degree of a program operation is a program initial period, based on the loop count of the plurality of program loops (S112). When the performance degree of the program operation is the program initial period (e.g., Yes in S112), during a second period after the first period, the page buffer controller 101 provide a first ramp signal as the page buffer sensing signal to the gate electrode of the page buffer sensing transistor (S113). The first ramp signal may increase with a first slope.

In one embodiment, during the second period after the first period, the page buffer controller 101 may provide the first ramp signal as the page buffer sensing signal to the gate electrode of the page buffer sensing transistor, in a program loop having a loop count equal to or less than a first reference count among the plurality of program loops.

When the performance degree of the program operation is not the program initial period (e.g., No in S112), the page buffer controller 101 may check whether the performance degree of the program operation is a program middle period, based on the loop count of the plurality of program loops (S114). When the performance degree of the program operation is a program last period (e.g., No in S114), operation S113 may be performed.

In one embodiment, during the second period, the page buffer controller 101 may provide the first ramp signal as the page buffer sensing signal to the gate electrode of the page buffer sensing transistor, in a program loop having a loop count greater than a second reference count among the plurality of program loops.

When the performance degree of the program operation is the program middle period (e.g., Yes in S114), during a third period instead of the second period, the page buffer controller 101 may provide a second ramp signal as the page buffer sensing signal to the gate electrodes of the page buffer sensing transistor (S115). The second ramp signal may increase with a second slope less than the first slope.

In one embodiment, during the third period, the page buffer controller 101 may provide the second ramp signal as the page buffer sensing signal to the gate electrode of the page buffer sensing transistor, in a program loop having a loop count which is greater than the first reference count or is equal to or less than the second reference count among the plurality of program loops.

After the ramp signal reaches the second voltage level, the memory device 100 may provide the page buffer 102 with a pulse signal as the page buffer sensing signal having a third voltage level greater than or equal to the second voltage level. The third voltage level may correspond to a turn-on voltage.

For example, after the second period or the third period, the page buffer controller 101 may check whether the second voltage level of the second ramp signal has reached the voltage level of the turn-on voltage (S116). When the second voltage level of the second ramp signal is not the voltage level of the turn-on voltage (e.g., No in S116), after the third period, the page buffer controller 101 may provide a pulse signal as the page buffer sensing signal to the gate electrode of the page buffer sensing transistor (S117). This pulse signal may have the third voltage level greater than the second voltage level.

When the second voltage level of the second ramp signal is the voltage level of the turn-on voltage (e.g., Yes in S116), after the second period, the pulse signal having the third voltage level (e.g., equal to the second voltage level) may be provided to a gate electrode of the page buffer sensing transistor, and operation S120 may be performed.

The program voltage apply operation S120 is performed after the precharge operation S110 and may include an operation in which the memory device 100 applies a program voltage to a word line commonly connected to a plurality of memory cells.

The verify operation S130 is performed after the program voltage apply operation S120 and may include an operation in which the memory device 100 determines whether selected memory cells have been programmed by applying verify voltages.

Figure 16:
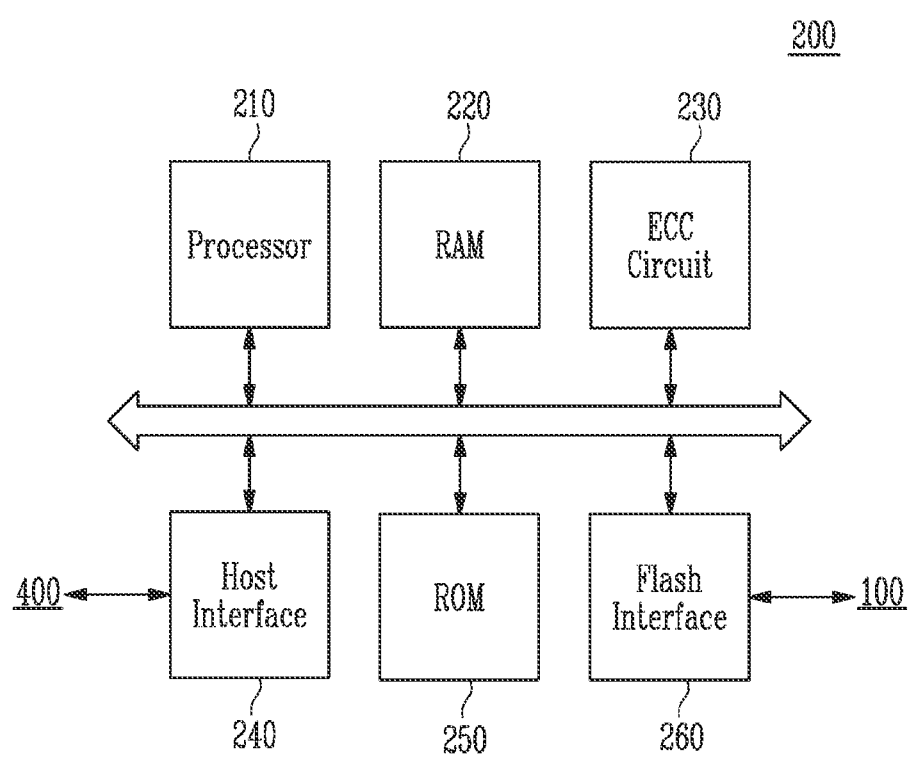
FIG. 16 illustrates an embodiment of a memory controller.

FIG. 16 is a diagram illustrating a memory controller 200 in accordance with an embodiment.

Referring to FIG. 16, the memory controller 200 may include a processor 210, a RAM 220, an error correction code (ECC) circuit 230, a host interface 240, a ROM 250, and a flash interface 260. The processor 210 may control overall operations of the memory controller 200.

The RAM 220 may be used as a buffer memory, a cache memory, a working memory, etc. of the memory controller 200. In one example, the RAM 220 may be a buffer memory.

The ECC circuit 230 may generate an ECC for correcting a fail bit or error bit of data received from the memory device 100. The ECC circuit 230 may generate data to which a parity bit is added by performing ECC encoding of data provided to the memory device 100. The parity bit may be stored in the memory device 100. The ECC circuit 230 may perform ECC decoding on data output from the memory device 100, and may correct an error by using a parity bit. For example, the ECC circuit 230 may correct an error using various coded modulations. Examples include an LDPC code, a BCH code, a turbo code, a Reed-Solomon code, a convolution code, an RSC, a TCM, and a BCM.

The ECC circuit 230 may calculate an ECC value of data to be programmed to the memory device 100 in a program operation. The ECC circuit 230 may perform an error correction operation on data read from the memory device 100 in a read operation, based on the ECC value. The ECC circuit 230 may perform an error correction operation of data recovered from the memory device 100 in a recovery operation of data which fails.

The memory controller 200 may communicate with an external device (e.g., the host 400, an application processor, or the like) through the host interface 240. The ROM 250 may store, in the form of firmware or other instructions, various information for operation of the memory controller 200. The memory controller 200 may communicate with the memory device 100 through the flash interface 260. The memory controller 200 may transmit a command CMD, an address ADDR, a control signal CTRL, and the like to the memory device 100 through the flash interface 260, and receive data DATA. The flash interface 260 may include, for example, a NAND interface.

Figure 17:
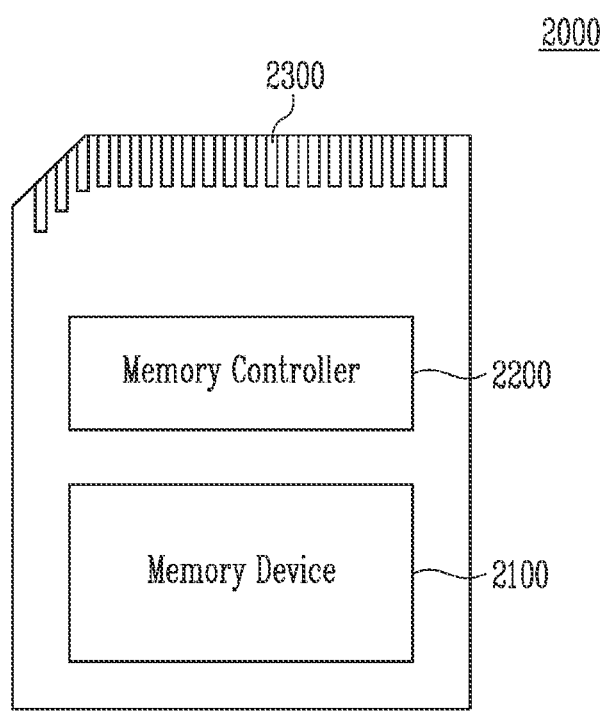
FIG. 17 illustrates an embodiment of a memory card system.

FIG. 17 is a block diagram illustrating a memory card system 2000 to which a storage device as described herein may be applied in accordance with an embodiment.

Referring to FIG. 17, the memory card system 2000 includes a memory device 2100, a memory controller 2200, and a connector 2300. The memory device 2100 may be, for example, a nonvolatile memory device. Examples include an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2200 is connected to the memory device 2100 and may access the memory device 2100. The memory controller 2200 may control, for example, read, write, erase, and background operations of the memory device 2100. The memory controller 2200 may serve as an interface between the memory device 2100 and a host Host. The memory controller 2200 drives firmware (or other instructions) for controlling the memory device 2100. The memory controller 2200 may be implemented, for example, in a manner similar or identical to the memory controller 200 described with reference to FIG. 1.

The memory controller 2200 may include components such as a Random Access Memory (RAM), a processing unit, a host interface, a memory interface, an error corrector and/or other components.

The memory controller 2200 may communicate with an external device through the connector 2300. The memory controller 2200 may communicate with the external device (e.g., host 400) according to at least one specific communication protocol, standard, or interface. Examples include a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be one compatible with at least one of the above-described communication protocols, standards, or interfaces.

The memory device 2100 and the memory controller 2200 may be integrated into a single semiconductor device, to constitute a memory card. For example, the memory controller 2200 and the memory device 2100 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 18:
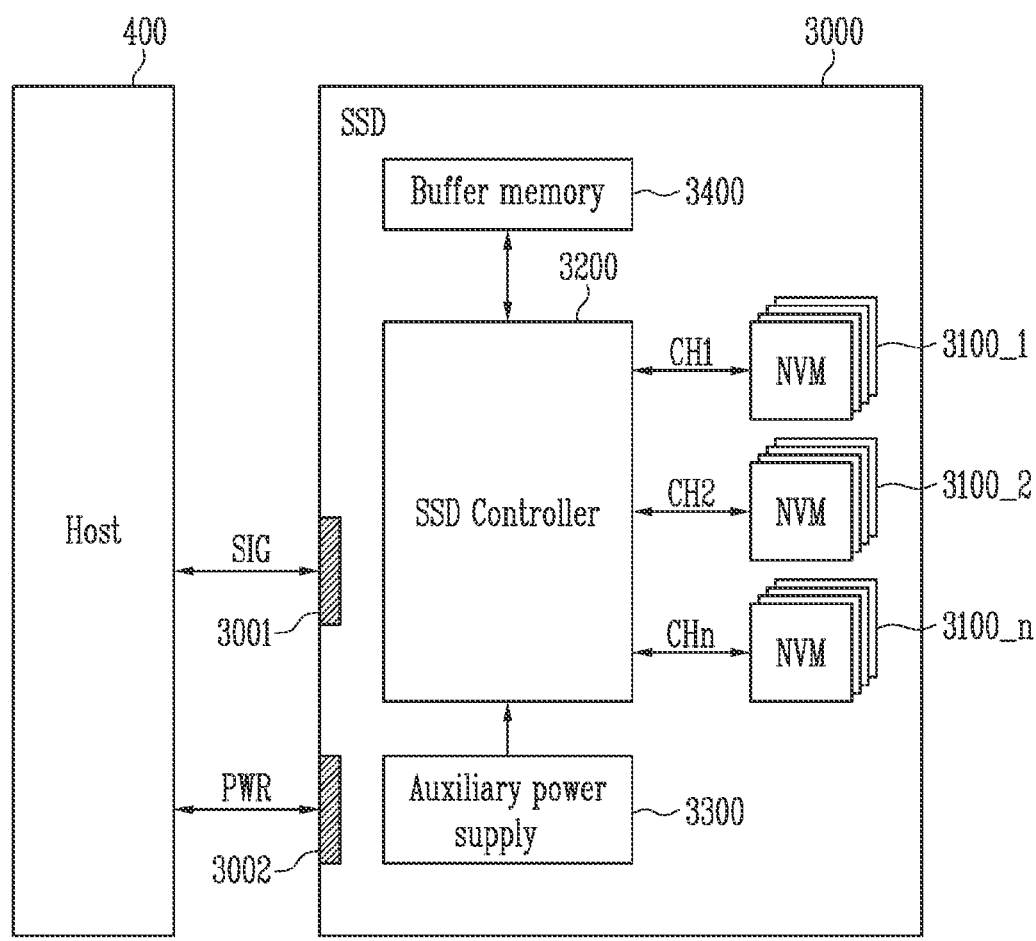
FIG. 18 illustrates an embodiment of a Solid State Drive (SSD) system.

FIG. 18 is a block diagram illustrating a Solid State Drive (SSD) system to which a storage device as described herein may be applied in accordance with an embodiment.

Referring to FIG. 18, the SSD 3000 exchanges a signal SIG with the host 400 through a signal connector 3001 and receives power PWR through a power connector 3002. The SSD 3200 includes an SSD controller 3200, a plurality of flash memories 3100_1, 3100_2, and 3100_n, an auxiliary power supply 3300, and a buffer memory 3400.

The SSD controller 3200 may perform, for example, the same function as the memory controller 200 described with reference to FIG. 1. The SSD controller 3200 may control the plurality of flash memories 3100_1, 3100_2, and 3100_n in response to a signal SIG received from the host 400. In one embodiment, the signal SIG may be a signal based on an interface between the host 400 and the SSD 3000. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3300 is connected to the host 400 through the power connector 3002. The auxiliary power device 3300 may receive the power PWR from the host 400 and may charge the power PWR. When the supply of power from the host 400 is not smooth (e.g., does not conform to a predetermined level or pattern), the auxiliary power supply 3300 may provide power of the SSD 3000. The auxiliary power supply 3300 may be located, for example, in the SSD 3000 or outside of the SSD 3000. For example, the auxiliary power supply 3300 may be on a main board to provide auxiliary power to the SSD 3000.

The buffer memory 3400 may temporarily store data. For example, the buffer memory 3400 may temporarily store data received from the host 400 or data received from the plurality of flash memories 3100_1, 3100_2, and 3100_n, or may temporarily store meta data (e.g., a mapping table) of the flash memories 3100_1, 3100_2, and 3100_n. The buffer memory 3400 may include a volatile memory, such as a DRAM, an SDRAM, a DDR SDRAM, an LPDDR SDRAM, and a GRAM or nonvolatile memories such as a FRAM, a ReRAM, an STT-MRAM, and a PRAM.

Figure 19:
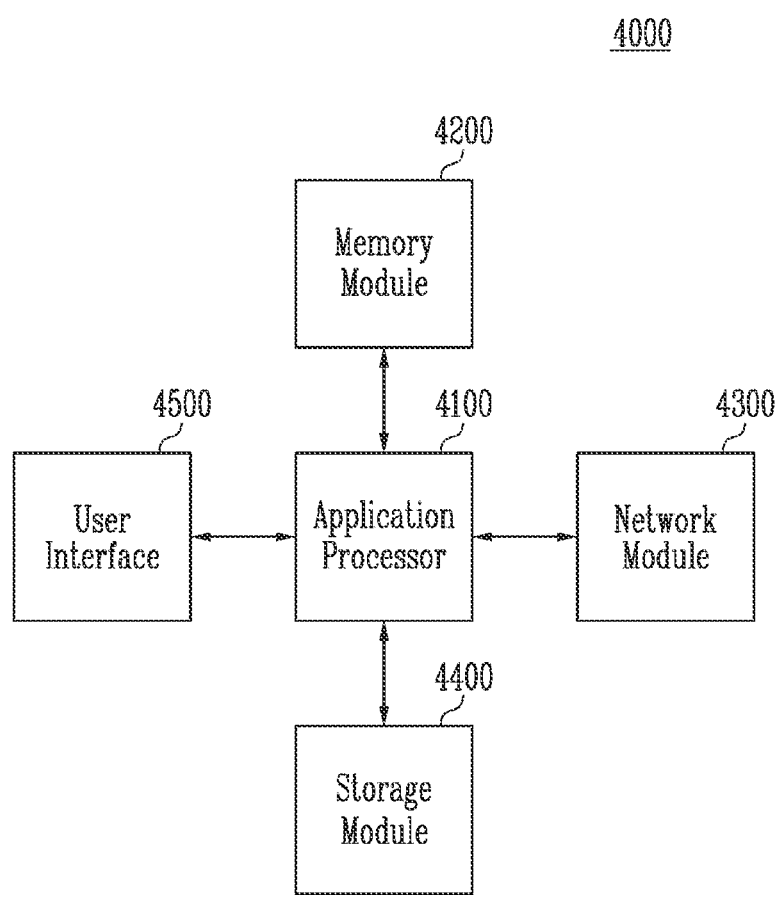
FIG. 19 illustrates an embodiment of a user system.

FIG. 19 is a block diagram of a user system to which a storage device as described herein may be applied in accordance with an embodiment.

Referring to FIG. 19, the user system 4000 includes an application processor 4100, a memory module 4200, a network module 4300, a storage module 4400, and a user interface 4500. The application processor 4100 may drive components included in the user system 4000, an operating system (OS), a user program, or the like. In one embodiment, application processor 4100 may include one or more controllers for controlling components in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include a volatile random access memory such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 4100 and memory module 4200 may be in one semiconductor package, e.g., Package on Package (PoP).

The network module 4300 may communicate with external devices using, for example, wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. Exemplarily, the network module 4300 may be included in the application processor 4100.

The storage module 4400 may store data, for example, received from the application processor 4100. In one embodiment, the storage module 4400 may transmit data stored therein to the application processor 4100. The storage module 4400 may be implemented to include, for example, a nonvolatile semiconductor memory device, such as a Phase-change RAM (PRAM), a Magnetic RAM (MRAM), a Resistive RAM (RRAM), a NAND flash, a NOR flash, or a NAND flash having a three-dimensional structure. The storage module 4400 may be provided, for example, as a removable drive such as a memory card of the user system 4000 or an external drive.

The storage module 4400 may operate, for example, in a manner similar or identical to the storage device 1000 described with reference to FIG. 1. The storage module 4400 may include one or more nonvolatile memory devices, which may operate in a manner similar or identical to the memory device 100 described with reference to FIG. 1.

The user interface 4500 may include one or more interfaces for inputting data and/or commands to the application processor 4100 and/or for outputting data to an external device. The user interface 4500 may include one or more user input interfaces (e.g., a keyboard, a keypad, a button, a touch panel, a touch screen, a touch pad, a touch ball, a camera, a microphone, a gyroscope sensor, a vibration sensor and a piezoelectric element) and/or one or more user output interfaces such as a Liquid Crystal Display (LCD), an Organic Light Emitting Diode (OLED) display device, an Active Matrix OLED (AMOLED) display device, an LED, a speaker, and a monitor.

In accordance with one or more of the aforementioned embodiments, a memory device achieves improved performance by decreasing the time of completion of a program operation and/or decreasing a peak current flowing through a bit line. A method for operating such a memory device is also provided.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. Two or more of the embodiments may be combined to form additional embodiments.

What is claimed is:

1. A memory device comprising:
a memory cell coupled to a bit line and a word line;
a page buffer coupled to the bit line, and configured to output a bit line voltage to the bit line in response to a page buffer sensing signal; and
control logic configured to:
output, to the page buffer, a signal increased from a first voltage level at a first time of a precharge period to a second voltage level at a second time of the precharge period, as the page buffer sensing signal,
in response to the second voltage level being less than a target voltage level, output, to the page buffer, a pulse signal having the target voltage level at a third time of the precharge period, as the page buffer sensing signal, and
output a control signal to provide a program voltage to the word line after the precharge period.

2. The memory device of claim 1, wherein a voltage level of the program voltage increases according to a count in which the program voltage is applied to the word line.

3. The memory device of claim 2, wherein a voltage level of the signal increases according to a slope value corresponding to the count among a plurality of slope values during a time period from the first time to the second time.

4. The memory device of claim 3, wherein the plurality of gradient values include:
a first gradient value corresponding to a count that is less than or equal to a first reference count;
a second slope value corresponding to a count that is greater than the first reference count, and is less than or equal to a second reference count greater than the first reference count; and
a third slope value corresponding to a count that is greater than the second reference count, and wherein each of the first slope value and the third slope value is greater than the second slope value.

5. The memory device of claim 3, wherein the voltage level of the signal continuously increases according to the slope value during the time period, or increases by once per a unit time according to the slope value during the time period.

6. The memory device of claim 1, wherein the control logic is configured to output, to the page buffer, as the page buffer sensing signal, a signal increased from a voltage level of a ground voltage to the first voltage level before the first time of the precharge period.

7. The memory device of claim 6, wherein the control logic is configured to output a control signal to provide a precharge voltage to the word line, while a signal having the voltage level of the ground voltage is output as the page buffer sensing signal before the first time of the precharge period.

8. The memory device of claim 1, wherein the control logic is configured to output a control signal to provide a ground voltage to the word line during a time period from the first time to the third time of the precharge period.

9. The memory device of claim 1, wherein the control logic is configured to output, to the page buffer, a ground voltage as the page buffer sensing signal while the program voltage is applied to the word line.

10. The memory device of claim 1, wherein the page buffer includes a page buffer sensing transistor configured to connect the bit line and a common sensing node in response to the page buffer sensing signal, and
wherein the second voltage level is a voltage level to turn on the page buffer sensing transistor.

11. The memory device of claim 1, wherein the bit line voltage is one of a program allow voltage and a program inhibit voltage.

12. A method of a memory device comprising a memory cell and a page buffer, the method comprising:
providing the page buffer with a signal increased from a first voltage level in a first time of the precharge period to a second voltage level in a second time of the precharge period;
in response to the second voltage level being less than a target voltage level, providing the page buffer with a pulse signal having the target voltage level at a third time of the precharge period; and
applying a program voltage to a word line connected to the memory cell after the precharge period.

* * * * *